United States Patent
Pidutti et al.

(10) Patent No.: US 9,960,705 B1
(45) Date of Patent: May 1, 2018

(54) RECTIFIER DEVICE WITH STAND-BY DETECTION CAPABILITY

(71) Applicant: Infineon Technologies AG, Neubiberg (DE)

(72) Inventors: Albino Pidutti, Martignacco (IT); Damiano Gadler, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/378,867

(22) Filed: Dec. 14, 2016

(51) Int. Cl.
- H02M 5/42 (2006.01)
- H02M 7/217 (2006.01)
- H02M 1/14 (2006.01)
- H02M 1/32 (2007.01)
- G01R 19/00 (2006.01)

(52) U.S. Cl.
CPC ........ *H02M 7/217* (2013.01); *G01R 19/0084* (2013.01); *H02M 1/14* (2013.01); *H02M 1/32* (2013.01)

(58) Field of Classification Search
CPC . H02M 1/4208; H02M 3/33592; H02M 7/217
See application file for complete search history.

(56) References Cited

U.S. PATENT DOCUMENTS

| | | | |
|---|---|---|---|
| 5,229,707 A * | 7/1993 | Szepesi | ............... H02H 1/04 323/222 |
| 5,748,463 A | 5/1998 | Tsutsui et al. | |
| 6,137,668 A | 10/2000 | Feldtkeller | |
| 6,768,623 B1 | 7/2004 | Shen | |
| 7,842,568 B2 | 11/2010 | Anderson et al. | |
| 8,013,586 B2 | 9/2011 | Tlaskal et al. | |
| 9,240,728 B2 | 1/2016 | Iorio et al. | |
| 9,281,680 B2 | 3/2016 | Nakayama | |
| 2011/0057630 A1 | 3/2011 | Saito et al. | |

OTHER PUBLICATIONS

U.S. Appl. No. 15/631,767, filed by Damiano Gadler et al., filed Jun. 23, 2017.
U.S. Appl. No. 15/474,669 filed by Damiano Gadler et al., filed Mar. 30, 2017.

(Continued)

*Primary Examiner* — Adolf Berhane
*Assistant Examiner* — Afework Demisse
(74) *Attorney, Agent, or Firm* — Shumaker & Sieffert, P.A.

(57) ABSTRACT

A rectifier device is described herein. In accordance with one example, the rectifier includes a first MOS transistor, which has a load current path and a diode connected parallel to the load current path, wherein an alternating input voltage is operably applied across the load current path and the diode. The rectifier device further includes a control circuit that is configured to switch on the first MOS transistor for an on-time period, during which the diode is forward biased. A stand-by detection circuit includes a cycle detection circuit configured to detect cycles of the alternating input voltage and a timer that is coupled to the cycle detection circuit. The timer is configured to be reset by the cycle detection circuit upon detection of a cycle of the alternating input voltage, and to disconnect a supply line of the control circuit unless reset before a maximum time span has elapsed.

20 Claims, 13 Drawing Sheets

(56) References Cited

OTHER PUBLICATIONS

U.S. Appl. No. 15/378,945, by Pidutti et al., filed Dec. 14, 2016.
U.S. Appl. No. 15/379,007, by Pidutti et al., filed Dec. 14, 2016.
U.S. Appl. No. 15/379,055, by Pidutti et al., filed Dec. 14, 2016.
Office Action from U.S. Appl. No. 15/379,007, dated Sep. 29, 2017, 7 pages.
Response to Office Action dated Sep. 29, 2017, from U.S. Appl. No. 15/379,007, filed Dec. 19, 2017, 12 pages.

* cited by examiner

RECTIFIER DEVICE WITH STAND-BY DETECTION CAPABILITY

TECHNICAL FIELD

The invention relates to the field of power supplies, in particular to rectifier circuits and devices and related methods and devices.

BACKGROUND

In the electric power grid electric electricity is usually distributed to customers in the form of alternating, current (AC) for various reasons. Furthermore, alternators are used, for example, in automobiles to generate alternating current. In many applications, alternating current has to be converted into direct current (DC) in order to provide a DC supply for electronic circuits or other devices, which need a DC supply. This conversion process is referred to as rectification. The standard components used to build a rectifier are silicon diodes. Several types of rectifier exists. One common type is a single-phase full-wave rectifier that is usually built using four diodes connected in a bridge configuration (a so-called Graetz bridge). As a side note, it should be mentioned that the alternating voltage provided by the electric power grid (e.g. 120 or 230 volts) is usually transformed to lower voltages using transformers before being rectified. In the automotive sector, alternators usually generate multiple-phase output voltages, and, for example, a suitable three-phase full-wave rectifier includes six diodes. Furthermore, rectifier diodes may also be used, for example, in (DC/DC or AC/DC) switching converters.

Silicon diodes have a forward voltages of approximately 0.6 to 0.7 volts, Schottky—and germanium diodes have slightly lower forward voltages of approximately 0.3 volts. The forward voltage of a pn-junction (i.e. of a diode) depends on the semiconductor material and therefore can be regarded practically as a constant parameter for a specific semiconductor manufacturing technology, which normally is based on silicon. It is understood, however, that the actual forward voltage is temperature dependent. That is, silicon diodes will always produce (at room temperature) a power dissipation of approximately 600 to 700 milliwatts per ampere load current. A diode bridge (bridge rectifier), which is composed of four diodes, thus produces a power dissipation of approximately 1.2 to 1.4 watts per ampere (RMS) of load current as two diodes are always forward biased in a diode bridge. Particularly for comparably low voltages (e.g. 5 to 15 volts) the power dissipation in the rectifier can be a significant portion of the total generated power.

To reduce power dissipation in rectifier devices, a technique referred to as active rectification may be used. Thereby, silicon diodes are replaced by power transistors such as power MOS field effect transistors (MOSFETs) or power bipolar junction transistors (BJTs), which have a comparably low on-resistance and thus may produce a significantly lower voltage drop as compared to simple silicon diodes. However, the control circuit used to switch the transistor on and off in synchronization with the alternating voltage as well as other circuitry integrated in the same semiconductor chip as the MOSFET may consume some quiescent current even if no alternating voltage is present (e.g. when the automobile is parked and the alternator stands still).

SUMMARY

A rectifier device is described herein. In accordance with one example, the rectifier includes a first MOS transistor, which has a load current path and a diode connected parallel to the load current path, wherein an alternating input voltage is operably applied across the load current path and the diode. The rectifier device further includes a control circuit that is configured to switch on the first MOS transistor for an on-time period, during which the diode is forward biased. A stand-by detection circuit includes a cycle detection circuit configured to detect cycles of the alternating input voltage and a timer that is coupled to the cycle detection circuit. The timer is configured to be reset by the cycle detection circuit upon detection of a cycle of the alternating input voltage, and to disconnect a supply line of the control circuit unless reset before a maximum time span has elapsed.

Furthermore, a rectifier device is described herein. In accordance with one example, the rectifier device includes a plurality of transistor cells, which are integrated in a semiconductor substrate, wherein the transistor cells connect a reference terminal and a substrate terminal of the rectifier device. A first transistor is composed of transistor cells included in the plurality of transistor cells, and a diode connects the reference terminal and the substrate terminal of the rectifier device. A control circuit is configured to switch on the first transistor for an on-time period, during which the diode is forward biased. Moreover, a stand-by detection circuit includes a cycle detection circuit, which is configured to detect cycles of a substrate voltage applied to the substrate terminal, and a timer, which is coupled to the cycle detection circuit. The timer is configured to be reset by the cycle detection circuit upon detection of a cycle of the substrate voltage, and to disconnect a supply line from the substrate terminal to the control circuit unless reset before a maximum time span has elapsed.

Moreover, a method for operating a rectifier device is described herein, wherein the rectifier device includes a semiconductor switch and a diode coupled in parallel between a first and a second terminal. In accordance with one example, the method includes using a control circuit to detect that the diode is forward biased and to activate the semiconductor switch to bypass the diode upon detection that the diode is forward biased. The method further includes continuously detecting new cycles of an alternating input voltage applied across the diode and the semiconductor switch, and disconnecting a supply line of the control circuit unless a new cycle of the alternating input voltage is detected before a maximum time span has elapsed.

BRIEF DESCRIPTION OF THE DRAWINGS

The invention can be better understood with reference to the following description and drawings. The components in the figures are not necessarily to scale, emphasis instead being placed upon illustrating the principles of the invention. Moreover, in the figures, like reference numerals designate corresponding parts. In the drawings:

FIG. 2 illustrates a power MOSFET which can be used to replace a diode in a rectifier circuit, wherein, in the embodiments described herein, the power MOSFET is reverse conducting when switched on.

DETAILED DESCRIPTION

Figure 1:
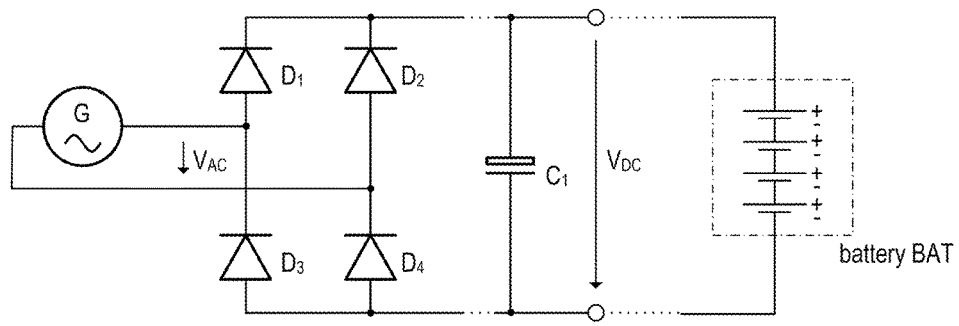
FIG. 1 illustrates, as an illustrative example, a single-phase full-wave rectifier circuit composed of four diodes.

As mentioned above, several types of rectifiers exists. FIG. 1 shows, as an illustrative example, a single-phase full-wave rectifier, which is built using four diodes $D_1$, $D_2$, $D_3$, $D_4$ connected in a bridge configuration (a so-called Graetz bridge or bridge rectifier). FIG. 1 also shows an AC voltage source G, which may represent, for example, the electric grid, the secondary side of a transformer, an AC generator such as an alternator used in an automobile, or any other common AC voltage source. The voltage source G provides an alternating voltage $V_{AC}$ supplied to the bridge rectifier. A capacitor $C_1$ may be connected to the output of the bridge rectifier to reduce the ripple of the DC output voltage $V_{DC}$. In the example of FIG. 1, an automotive battery BAT is coupled to the bridge rectifier so that the battery can be charged by the generator G. Silicon diodes usually have a forward voltage of approximately 0.6 to 0.7 volts, and therefore may cause significant power dissipation. To reduce the power dissipation, a silicon diode may be replaced by a rectifier device including a controllable semiconductor switch. In the example illustrated in FIG. 2, the rectifier device 10 includes a power MOS transistor $M_P$, which has an intrinsic diode $D_R$ (body diode) coupled in parallel to the load current path (drain-source current path) of the power MOS transistor $M_P$. Anode and cathode of the rectifier device 10 correspond to anode and cathode of the intrinsic diode and are labelled A and K, respectively. In the examples described herein, the power MOS transistor is a MOSFET with the intrinsic diode being the MOSFETs body diode. In this context, however, an IGBT (which is also switched on and off by a MOS gate) may also be regarded as a MOS transistor, wherein the IGBT may have a reverse diode integrated in the same semiconductor die as the IGBT.

Unlike in known active rectifier circuits (also referred to as "synchronous rectifiers"), the MOSFET $M_P$ is operated in a reverse conducting mode. In essence, a standard rectifier diode (as used for example in the bridge rectifier of FIG. 1) is replaced by the body diode of a power MOSFET, which can be bypassed by the MOS channel of the MOSFET, when the MOSFET is switched on. That is, the MOSFET is switched on (which makes the MOS channel conductive), when the body diode is forward biased, thus bypassing the current path through the body diode. When the diode $D_R$ is reverse biased the MOSFET $M_P$ is always off. In the example depicted in FIG. 2, the rectifier device 10 has only two terminals, a first terminal A (anode terminal, connected to the anode of the body diode $D_R$) and a second terminal K (cathode terminal, connected to the cathode of the body diode $D_R$). As will be explained later, the control circuit used for switching the MOSFET $M_P$ on and off may be integrated in the same semiconductor die as the MOSFET $M_P$, and the internal supply of the integrated control circuit may be internally generated from the AC voltage applied at the two terminals A and K.

Figure 2:
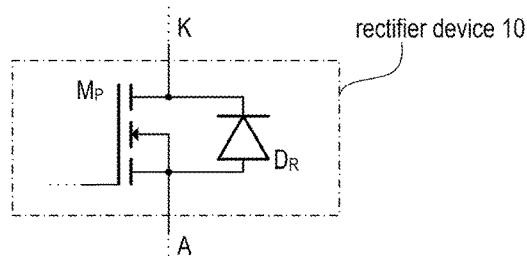
Figure 3:
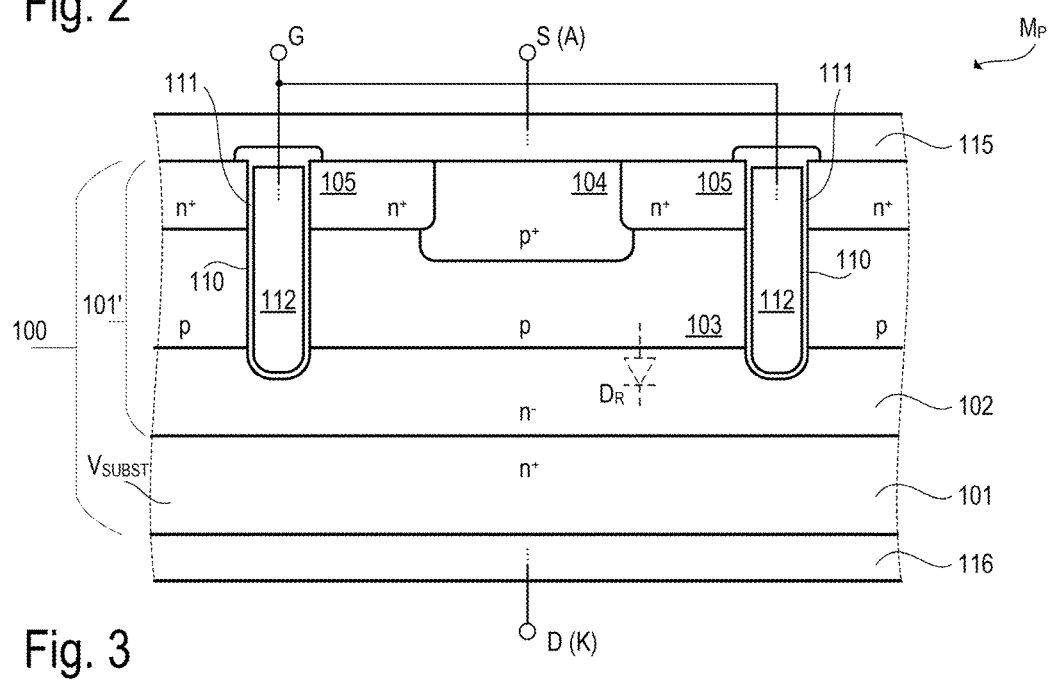
FIG. 3 is a cross-sectional view of a semiconductor body illustrating exemplary implementation of the power MOSFET of FIG. 2.

FIG. 3 illustrates one exemplary implementation of the power MOSFET $M_P$ of FIG. 2 in a silicon substrate. In the present example, the MOSFET is implemented using a vertical transistor structure composed of a plurality of transistors cells. The term "vertical" is commonly used in the context of power transistors and refers to the direction of the load current path (MOS channel), which extends vertically with respect to a horizontal plane defined by the bottom plane of the semiconductor substrate. The term "vertical" can thus be used to discriminate vertical transistors from planar transistors, in which the load current path (MOS channel) extends parallel to the horizontal plane. In the present example, the vertical MOS transistor is implemented as a so-called trench transistor, which has its gate electrodes arranged in trenches formed in the silicon body. However, other types of vertical power transistors or other types of transistors may be used.

In the example of FIG. 3, the semiconductor body 100 is essentially formed by a semiconductor substrate 101 (wafer), on which a (e.g. monocrystalline) semiconductor layer 101' is deposited using epitaxial growth. The semiconductor substrate 101 and the semiconductor layer 101' may be doped with dopants of a first doping type, e.g. n-type dopants, wherein the concentration of dopants may be much lower in the semiconductor layer 101' (therefore labelled n⁻) as compared to the highly doped substrate 101 (labelled n⁺).

Trenches 110 are formed in the semiconductor layer by an anisotropic etching process. The trenches 110 extend—from the top surface of the semiconductor body 100—vertically into the semiconductor body 100 and are filled with conductive material (e.g. highly doped polycrystalline silicon) to form gate electrodes 112 within the trenches 110. The gate electrodes 112 are isolated from the surrounding semiconductor body 100 by an oxide layer 111, which is disposed on the inner surfaces of the trenches 110 before filling them with the mentioned conductive material.

An upper portion of the semiconductor layer 101' is doped with dopants of a second doping type, e.g. p-type dopants, e.g. using a first doping process (e.g. diffusion process of dopants or ion implantation). The resulting p-doped region is usually referred to as body region 103, whereas the remaining n-doped portion of the semiconductor layer 101' (directly adjoining the substrate 101) forms the so-called drift region 102 of the MOS transistor. As the trenches 110 extend down to the drift region 102, the body region 102 is segmented into a plurality in body regions associated with a respective plurality of transistor cells.

A second doping process (e.g. diffusion process of dopants or ion implantation) is used to form source regions 105. Therefore, the MOSFET $M_P$ is also referred to as DMOS (double-diffused metal-oxide-semiconductor) transistor. The source regions are doped with dopants of the same type as the substrate 101 (e.g. n-type dopants). The concentration of dopants may be comparably high (therefore labelled $n^+$), but is not necessarily equal to the concentration of dopants in the substrate 101. The source regions 105 extend vertically into the semiconductor body starting from the top surface of the semiconductor body and adjoining the trenches 112. Body contact regions 104, which are doped with dopants of the same type as the body regions 103, may be formed between neighboring trenches 110 in order to allow to electrically contact the body regions 103 at the top surface of the semiconductor body 100. The source regions 105 and the body contact regions 104 are electrically contacted at the top surface of the semiconductor body 100 by the conductive layer 115 (e.g. metal layer) that forms the source electrode S of the power MOSFET (DMOS transistor). Thereby the individual transistors cells are electrically connected in parallel. The gate electrodes 112 in the trenches 110 have to be isolated from the conductive layer 115 and are also connected to each other, e.g. at the end of the trenches 110 (not visible in FIG. 3). The drain electrode D is formed by another conductive layer 116 at the bottom surface of the semiconductor body 100.

The body diode $D_R$ (see also FIG. 3) of the MOSFET is also shown in the cross-sectional view of FIG. 3. It is formed by the p-n junctions at the transition between the body regions 103 (in each transistor cell) and the drift region 102. The source electrode S (which is electrically connected to the source and body contact regions) is therefore also the anode of the diode $D_R$, and the drain electrode D is also the cathode of the diode $D_R$. A transistor designed according to the example of FIG. 3 or similar transistor designs are as such known (sometimes referred to as DMOS transistor) and thus not further explained in more detail.

Figure 4:
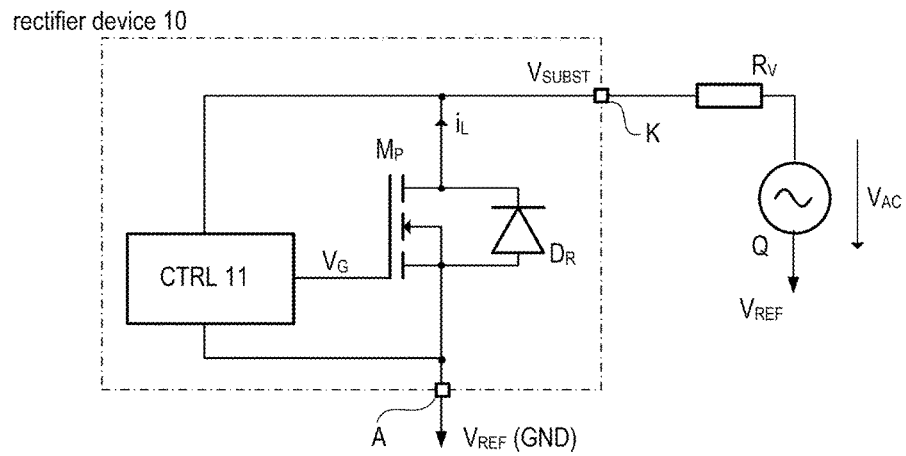
FIG. 4 is a circuit diagram illustrating the power MOSFET of FIG. 2 and a control circuit that is configured to actively switch the MOSFET on when the body diode becomes forward biased.

What should be mentioned at this point is that the MOS transistor $M_P$ is not the only component integrated in the substrate. All other circuitry needed for controlling the switching operation of the MOS transistor $M_P$ is also integrated in the same semiconductor body 100. The embodiments described herein may be designed as two-terminal rectifier devices (anode or reference terminal A and cathode or substrate terminal K), which have only two external pins and behave essentially like diodes. Unlike a normal diode, the rectifier devices described herein may be designed to have a very low forward voltage as the low-resistive MOS channel bypasses the current path through the body diode $D_R$ while the body diode is forward biased. In the following, the potential at the first terminal A (anode terminal, corresponds to the source electrode of the power MOSFET $M_P$) is denoted as reference voltage $V_{REF}$, whereas the voltage at the second terminal K (cathode terminal, corresponds to the drain electrode of the power MOSFET $M_P$) is denoted as substrate voltage $V_{SUBST}$ (voltage present in the substrate 101, see FIG. 3). FIG. 4 illustrates the rectifier device 10 of FIG. 2 in more detail. Accordingly, the rectifier device includes the MOSFET/DMOS transistor $M_P$ (include the intrinsic reverse diode $D_R$, see FIG. 2 and a control circuit 11 connected to a gate terminal of the MOSFET $M_P$. As explained above, the MOSFET $M_P$ and its intrinsic body diode $D_R$—and also the control circuit 11—are connected between the first and the second terminals A and K, respectively. The electric potential $V_{REF}$ at the first terminal (anode) can be defined as zero volts (0 V) and can thus be regarded as reference or ground potential for all circuitry integrated in the semiconductor body 100. With respect to the reference potential $V_{REF}$, the substrate voltage $V_{SUBST}$ may vary from negative values of (at room temperature) approximately −0.7 volts minimum (i.e. the negative forward voltage of the body diode $D_R$) to a positive peak value $V_{AC\_MAX}$ of an alternating input voltage $V_{AC}$ applied between the two terminals A and K. In the example of FIG. 4, the rectifier device 10 is supplied by an AC source Q via a resistor $R_V$. Supplying the rectifier device 10 has to be regarded as a merely hypothetical example, which is used to explain the function of the rectifier device.

Figure 5:
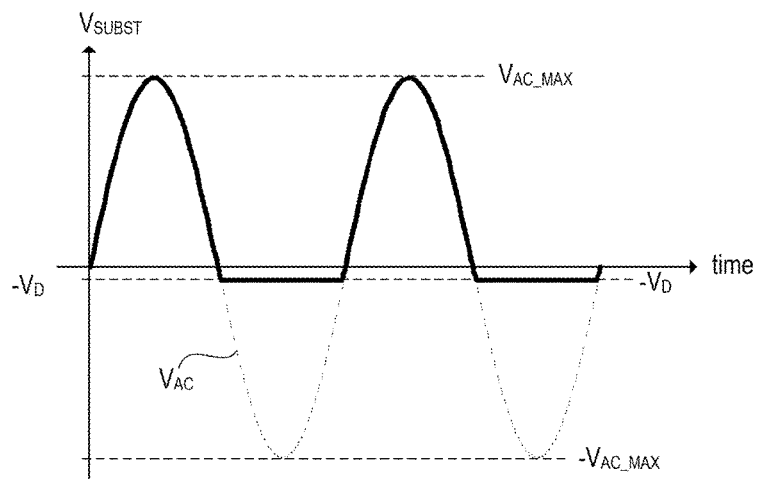
FIG. 5 is a timing diagram illustrating the voltage across the body diode of the MOSFET of FIG. 4, when the MOSFET is connected to a load and not actively switched on while being supplied with an alternating voltage.

FIG. 5 is a timing diagram illustrating the waveform of the substrate voltage $V_{SUBST}$ with respect to the reference potential $V_{REF}$ for the hypothetic case, in which the MOSFET $M_P$ included in the rectifier device 10 is never switched on and, therefore, the load current it can only pass the rectifier device 10 via the body diode $D_R$. in this example it is further assumed that an alternating input voltage $V_{AC}$ is applied to a series circuit of the rectifier device 10 and a load (see FIG. 4, resistor $R_V$). Without loss of generality, the reference potential $V_{REF}$ may be defined as 0 V. While the body diode $D_R$ is reverse biased ($V_{SUBST}$>0 V), the substrate voltage $V_{SUBST}$ follows the alternating input voltage $V_{AC}$ and the load current is approximately zero (diode $D_R$ is blocking). While the body diode $D_R$ is forward biased ($V_{SUBST}$<0 V), the substrate voltage $V_{SUBST}$ follows the alternating input voltage $V_{AC}$ as long as the alternating input voltage $V_{AC}$ is higher than the negative forward voltage $-V_D$ of the body diode $D_R$ (e.g. $V_{AC}$>−0.6V). However, when the alternating input voltage $V_{AC}$ becomes lower than the negative forward voltage $-V_D$ of the body diode $D_R$ (e.g., $V_{AC}$<−0.6V), the substrate voltage will be approximately limited to the negative forward voltage $-V_D$ of the body diode $D_R$ (e.g., $V_{SUBST}$≈−0.6V), the diode $D_R$ is conductive, and the difference between the (negative) substrate voltage and the alternating input voltage $V_{AC}$ is the voltage drop across the load. The load current is actually passing through the rectifier device 10 (while $V_{AC}$<−$V_D$) depends on the load.

As mentioned above, a voltage drop across the rectifier device 10 of approximately 600 to 700 mV (at room temperature) may cause a significant power dissipation. To reduce the substrate voltage $V_{SUBST}$ while the body diode $D_R$ is forward biased, the MOS transistor $M_P$ can be switched on to make the MOS channel of the MOS transistor $M_P$ conductive. In this case, the body diode $D_R$ is bypassed via the low-ohmic current path provided by the MOS channel. However, in the time period, in which the body diode $D_R$ is reverse biased (i.e. blocking), the MOS transistor should remain switched off. The logic circuit controlling the switching operation of the MOS transistor $M_P$ is included in the control circuit 11 (see FIG. 4).

As shown in FIG. 4, the control circuit 11 is coupled between the two terminals A and K, at which the alternating input voltage is applied (see FIG. 5). However, some circuit components in the control circuit 11 need a DC supply voltage in order to operate properly. Therefore, the control circuit 11 includes at least one supply circuit, which provides an internal supply voltage $V_S$ for supplying various other circuit components of the control circuit 11. Before explaining exemplary implementations of the control circuit 11 and its function in more detail, two exemplary implementations of supply circuits are explained with reference to FIG. 6.

Figure 6:
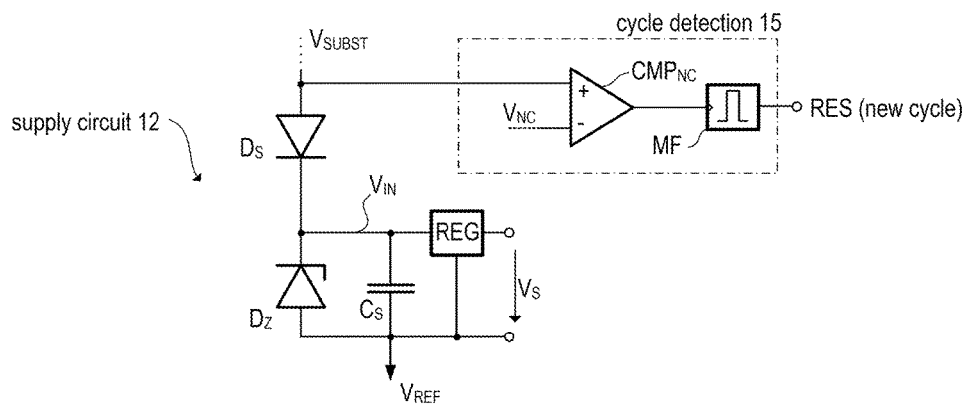
FIG. 6 is a circuit diagram illustrating an exemplary supply circuit, which may be included in the control circuit to supply the control logic used to switch the MOSFET of FIG. 4 on and off.

The exemplary supply circuit 12 illustrated in FIG. 6 is coupled between the first (anode) terminal A (reference potential $V_{REF}$) and the second (cathode) terminal K (substrate voltage $V_{SUBST}$), which are connected to the source and drain of the MOSFET $M_P$, respectively. A series circuit composed of a diode $D_S$ and a Zener diode $D_Z$ is electrically connected between the substrate (being at substrate voltage $V_{SUBST}$) and the source electrode of the MOSFET $M_P$ (being at reference potential $V_{REF}$). A buffer capacitor $C_S$ is connected parallel to the Zener diode $D_Z$ as shown in FIG. 6. The capacitor $C_S$ is charged via the diode $D_S$ when the level of the substrate voltage $V_{SUBST}$ is higher than the sum of the voltage $V_{IN}$ across the capacitor $C_S$ and the forward voltage of the diode $D_S$. The Zener diode $D_Z$ limits the capacitor voltage $V_{IN}$ across the capacitor $C_S$ to a maximum value, which is determined by the Zener voltage of the Zener diode $D_Z$. Furthermore, the diode $D_S$ prevents the discharging of the capacitor $C_S$ via the substrate when the substrate voltage $V_{SUBST}$ falls to values lower than the capacitor voltage $V_{IN}$. The capacitor voltage $V_{IN}$ may be supplied as input voltage to a voltage regulator device REG, and the input voltage $V_{IN}$ is buffered by the capacitor $C_S$ while the substrate voltage $V_{SUBST}$ is low. The regulated output voltage of the voltage regulator REG is denoted as $V_S$. The regulated output voltage $V_S$ may be regarded as internal supply voltage that is used to supply any circuitry (such as logic circuits) integrated in the rectifier device 10.

Also shown in FIG. 6 but not part of the supply circuit 12 is a cycle detection circuit 15 that essentially includes a comparator $CMP_{NC}$, which is configured to signal at its output a new cycle of the substrate voltage $V_{SUBST}$. The comparator $CMP_{NC}$ may be supplied by the internal supply voltage $V_S$. In the present example, the comparator compares the substrate voltage $V_{SUBST}$ with the threshold voltage $V_{NC}$, which may be equal to the reference voltage $V_{REF}$ or may be a small positive value in the range of a few millivolts. The threshold voltage $V_{NC}$ is applied to the inverting input of the comparator $CMP_{NC}$ and the substrate voltage $V_{SUBST}$ is applied to the non-inverting input of the comparator $CMP_{NC}$. Thus, the comparator $CMP_{NC}$ generates a rising edge at its output when the substrate voltage $V_{SUBST}$ rises above the threshold voltage $V_{NC}$. This rising edge may trigger a mono-flop MF, which is connected to the output of the comparator $CMP_{NC}$ and generates a reset pulse of a defined pulse length in each cycle of the alternating substrate voltage $V_{SUBST}$.

It is noted, that the circuit of FIG. 6 has to be regarded as an illustrative example and may also be implemented in various alternative ways. For example, the Zener diode $D_Z$ may be replaced by a any clamping circuit configured to limit the capacitor voltage to a desired maximum. Dependent on the application the Zener diode may be omitted. The capacitor $C_S$ may be replaced by any circuit (e.g. series or parallel circuit of several capacitors) providing a sufficient capacitance to be able to buffer the input voltage $V_{IN}$ while the substrate voltage is too low to charge the capacitor $C_S$. In some implementations, the voltage regulator REG may be substituted by other circuitry that provides a similar function. if capacitance of the capacitor $C_S$ is high enough to ensure an acceptably low ripple, the regulator REG may be also omitted. As mentioned, various modifications and enhancements of the basic example of FIG. 6 may be considered. For example, a source follower may be connected between the cathode of diode $D_S$ and the voltage regulator REG, wherein the gate of the source follower is connected to a substantially constant voltage (e.g. generated using a Zener diode). This would limit the capacitor voltage to a desired maximum and reduce current consumption.

Figure 7A:
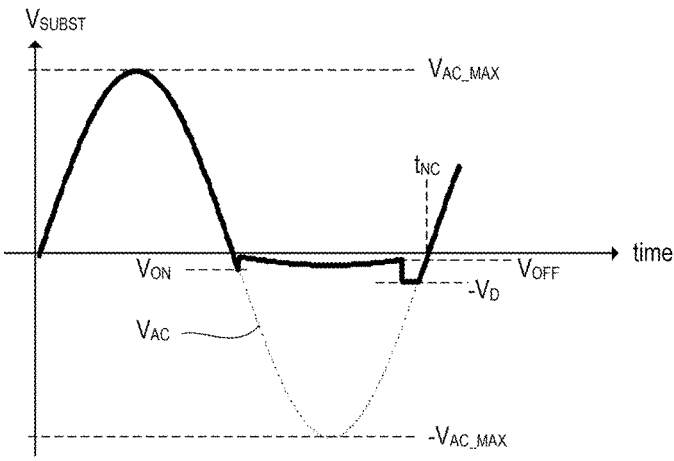
FIGS. 7A and 7B are timing diagrams illustrating the switching of the MOSFET FIG. 4, when supplied with an alternating voltage.
Figure 7B:
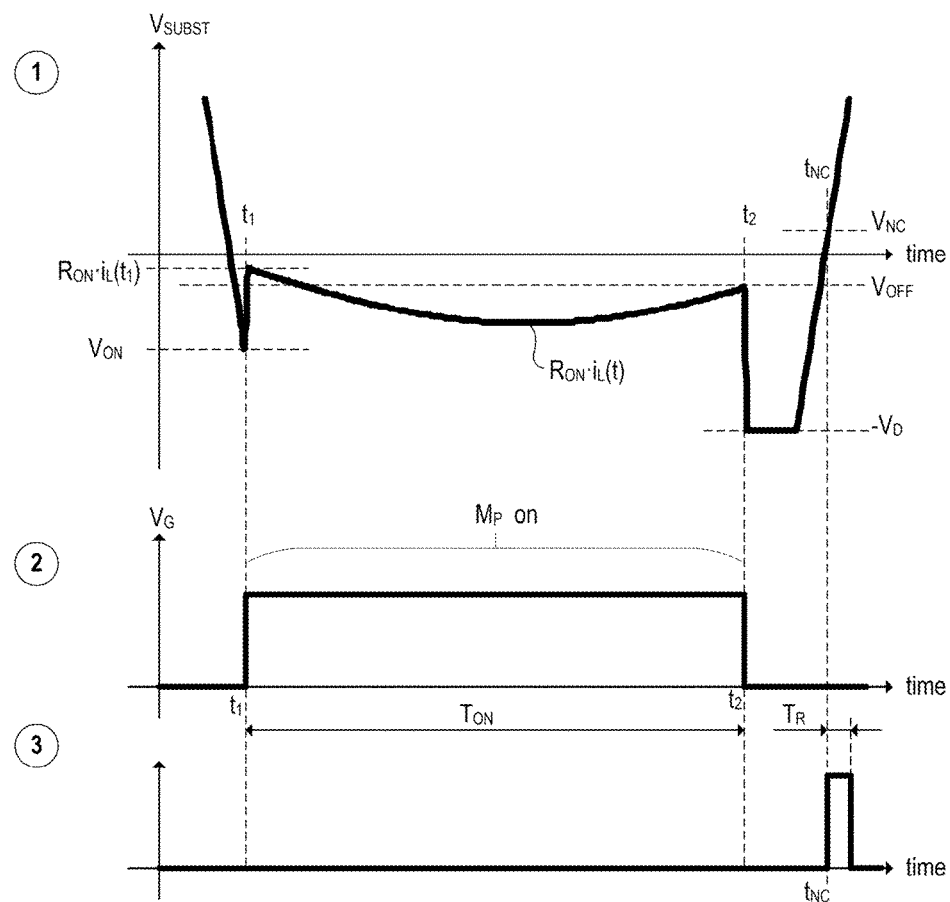

FIG. 7A is a timing diagram illustrating the function of one exemplary embodiment of the rectifier device implemented according to the basic example of FIG. 4. In particular, the switching on and switching off of the MOS transistor $M_P$ is illustrated. The diagram of FIG. 7A is essentially the same as the diagram of FIG. 5 except that, in the current example, power MOS transistor $M_P$ is switched on, when the intrinsic body diode $D_R$ is forward biased in order to bypass the body diode via the activated MOS channel. The bypassing of the body diode $D_R$ results in a voltage drop across the rectifier device 10, which is significantly lower than the forward voltage of a normal diode. The first diagram of FIG. 7B illustrates a magnified detail of the waveform shown in FIG. 7A. FIG. 7A shows a full cycle of the substrate voltage $V_{SUBST}$, whereas the first diagram of FIG. 7B only shows approximately the second half of the cycle, during which the substrate voltage $V_{SUBST}$ is negative. The second diagram illustrates a simplified waveform of the gate voltage applied to the MOS transistor $M_P$ to switch it on and off. The third diagram of FIG. 7B illustrates the reset signal RES including the reset pulses, which may be generated by the cycle detection circuit 15 shown in FIG. 6. As can be seen in FIGS. 7A and 7B, the MOS transistor $M_P$ is switched on, when the control circuit 11 detects that the substrate voltage $V_{SUBST}$ is negative (i.e. the diode $D_R$ is forward biased). To determine the time instants for switching the MOS transistor $M_P$ on and off (i.e. begin and end of the on-time period $T_{ON}$ of MOS transistor $M_P$) negative threshold voltages $V_{ON}$ and $V_{OFF}$ may be used as explained below. Accordingly, the MOS transistor $M_P$ is switched on, when the substrates voltage $V_{SUBST}$ reaches or falls below the first threshold $V_{ON}$. In the present example, the condition $V_{SUBST}=V_{ON}$ is fulfilled at time $t_1$ and the gate voltage $V_G$ (see second diagram of FIG. 7B) is set to a high level to switch the MOS transistor $M_P$ on. When the substrate voltage $V_{SUBST}$ reaches or exceeds the second threshold $V_{OFF}$ at the end of a cycle, the MOS transistor $M_P$ is switched off again. In the present example, the condition $V_{SUBST}=V_{OFF}$ is fulfilled at time $t_2$ and the gate voltage $V_G$ (see bottom diagram of FIG. 7B) is set to a low level to switch the MOS transistor $M_P$ off. When the MOS transistor $M_P$ is switched off at time $t_2$, the substrate voltage $V_{SUBST}$ may abruptly fall to $-V_D$ before it again rises to positive values at the beginning of the next cycle (reset pulse at time instant $t_{NC}$).

While the MOS transistor $M_P$ is switched on, the substrate voltage $V_{SUBST}$ equals Row h., wherein RUN is the on-resistance of the activated MOS channel. In the present example only two threshold values are used to switch the MOS transistor $M_P$ on and off, respectively. However, two or more threshold values may be used for the switch-on and/or the switch-off. in this case the power MOSFET is switched on/off gradually by subsequently switching on/off two or more groups of transistor cells of the power MOSFET. A more detailed example of a rectifier device, in which the power MOSFET is switched off in, for example, two steps is explained later with regard to FIG. 12.

Referring back to FIG. 7A, both, the first threshold $V_{ON}$ and the second threshold $V_{OFF}$ are negative (note that the reference voltage $V_{REF}$ is defined as zero), but higher than the negative forward voltage $-V_D$ of the body diode $D_R$ of the MOS transistor $M_P$. Furthermore, the second threshold $V_{OFF}$ is higher than the first threshold $V_{ON}$. That is, the condition $-V_D < V_{ON} < V_{OFF} < 0$ is fulfilled in the present example, e.g. $V_{ON} = -250$ mV and $V_{OFF} = -50$ mV, while $-V_D \approx -600$ mV. As can be seen in FIG. 7B, the MOS transistor should only switch on once in each cycle when the condition $V_{SUBST} = V_{ON}$ is met for the first time. When the condition is met again in the same cycle, a second switch-on of the MOS transistor $M_P$ should be prevented (e.g. at time instant $t_2$, see first diagram of FIG. 7A). Similarly, the MOS transistor $M_P$ should be switched off when the condition $V_{SUBST} = V_{OFF}$ is me at the end of a cycle. If this condition is met earlier during a cycle (e.g. shortly after time $t_1$, if $R_{ON} \cdot i_L(t_1) > V_{OFF}$), an early switch-off of the MOS transistor should be prevented. In order to avoid an undesired early switch-off of the MOS transistor, the control circuit may include a timer that prevents a switch-off for a specific time span. One exemplary implementation of control logic, which may be included the control circuit 11, is described below with reference to FIG. 8.

Figure 8:
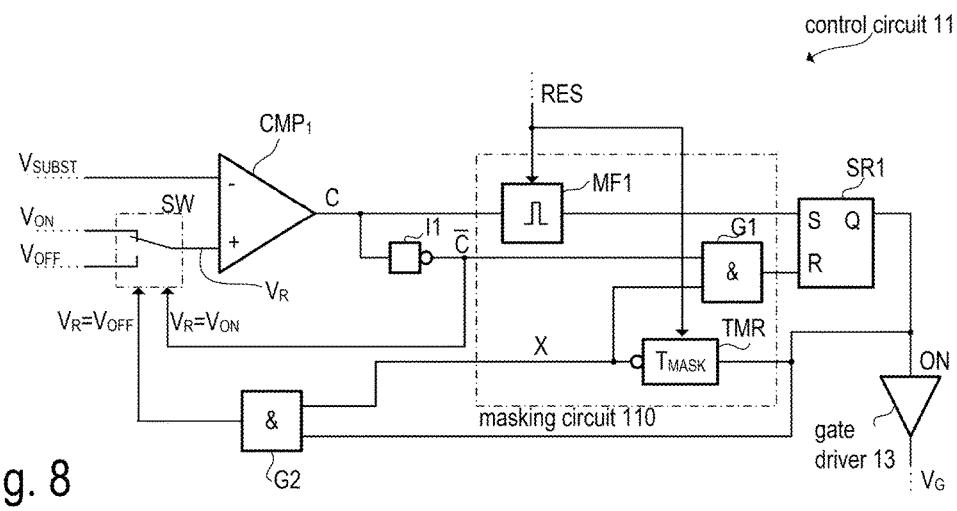
FIG. 8 is a block diagram illustrating one exemplary control logic for switching the MOSFET of FIG. 4 on and off as shown in the diagram of FIGS. 7A and 7B.

FIG. 8 is a block diagram illustrating one exemplary implementation of a control logic for the control circuit 11 (see FIG. 4) which is designed to switch the MOS transistor $M_P$ on and off as illustrated in the timing diagrams of FIGS. 7A and 7B. Various circuit components used in the circuit of FIG. 8 may be supplied by a supply circuit 12 as shown, for example, in FIG. 6 (internal supply voltage $V_S$). In the present example, be control logic includes a comparator $CMP_1$ that receives the substrate voltage $V_{SUBST}$ at a first input (e.g. inverting input) and a threshold voltage $V_R$ at a second input (e.g. non-inverting input). The substrate voltage $V_{SUBST}$ and the threshold voltage $V_R$ are compared by the comparator $CMP_1$, which generates a binary comparator output signal C (high/low logic signal). An inverter 11 is connected to the comparator output and generates an inverted comparator output signal $\overline{C}$. A level transition (dependent on the implementation from a low level to a high level or vice versa) occurs in the comparator output C when the substrate voltage $V_{SUBST}$ reaches the threshold voltage $V_R$. In the present example, the comparator $CMP_1$ generates a high level when the substrate voltage $V_{SUBST}$ is below the threshold voltage $V_R$.

To implement the switching scheme shown in FIG. 7B, the threshold voltage $V_R$ may be switched from a first value $V_{ON}$ to a second value $V_{OFF}$ (and vice versa) using, for example, an electronic switch SW. In the present example, the electronic switch SW is configured to apply either the first threshold voltage $V_{ON}$ or the second voltage $V_{OFF}$ (as reference voltage $V_R$) to the second comparator input. The comparator output is coupled to the set and reset inputs of a SR flip-flop SR1 via a masking circuit 110. The masking circuit 110 is designed to prevent a multiple switch-on and an undesired early switch-off of the power MOSFET $M_P$. The SR flip-flop SR1 is activated, when the comparator output signal C indicates (e.g., by a specific level or a level transition) that the substrate voltage $V_{SUBST}$ has reached the threshold voltage $V_R = V_{ON}$. The SR flip-flop SR1 is reset, when the comparator output signal C indicates that the substrate voltage $V_{SUBST}$ has reached the threshold voltage $V_R = V_{OFF}$, wherein the reference voltage $V_R$ is changed from $V_{ON}$ to $V_{OFF}$ some time after the SR flip-flop SR1 has been activated and changed back from $V_{OFF}$ to $V_{ON}$ when the SR flip-flop SR1 is deactivated. The output signal ON of the SR flip-flop SR1 signals the switch-on and switch-off of the MOS transistor $M_P$ (e.g. via a gate diver circuit 13). In the present example, the MOS transistor $M_P$ is switched on when the output signal ON of the SR flip-flop SR1 is set to a high level, and the MOS transistor $M_P$ is switched off when the output signal ON of SR flip-flop SR1 is reset to a low level (see also FIG. 7B).

As mentioned, the masking circuit 110, which is connected between the comparator $CMP_1$ and the SR flip-flop SR1, is provided to avoid a multiple switch-on of the power MOS transistor MP as well as an early switch-off during a cycle of the substrate voltage $V_{SUBST}$. To ensure that the SR flip-flop SR1 is only set once in each cycle of the substrate voltage $V_{SUBST}$ the masking circuit 110 includes an edge-triggered monoflop MF1, which is also referred to as "one-shot". The monoflop MF1 is configured to generate a single pulse at its output in response to a rising edge in the comparator output signal C, which is applied to the input of the monoflop MF1. Once an output pulse (a "shot") has been generated by the monoflop MF1 to set the SR flip-flop SR1, further output pulses can be generated before reset of the monoflop MF1, e.g. by reset signal RES. The reset signal RES may be provided by the supply circuit shown in FIG. 6 or any other circuit configured to detect the start of a new cycle of the substrate voltage $V_{SUBST}$. In essence, the output of the monoflop MF1 (and thus the set-input (S) of the SR flip-flop SR1) is masked for the rest of the cycle of the substrate voltage $V_{SUBST}$ once a set pulse has been generated for the SR flip-flop SR1.

Furthermore, the masking circuit 110 includes a timer circuit TMR that may be coupled between the output (Q) of the SR flip-flop SR1 and (e.g. via a gate circuit G1) the reset input (R) of the SR latch FL2. The timer circuit TMR is triggered by the output signal ON of SR flip-flop SR1 and generates an output signal (masking signal X) that has a high-level except for a defined time span $T_{MASK}$ directly after the SR flip-flop SR1 has been set. That is, the masking signal exhibits a low-level during the time span $T_{MASK}$. While signal X is low, any reset signal (provided by inverter 11) for resetting the SR flip-flop SR1 (and thus for switching-off the MOS transistor $M_P$) is masked. The SR flip-flop SR1 can be reset by a reset pulse in the inverted comparator output signal $\overline{C}$ which is supplied to the reset input (R) of the SR flip-flop SR1 via AND gate G1, winch blanks the signal $\overline{C}$ while the masking signal X (supplied to a first input of the AND gate G1) is at a low-level. In other words, the inverted comparator output signal $\overline{C}$, which is applied to the second input of AND-gate G1, cannot pass from the second input to the output of the AND -gate G1 during the time span $T_{MASK}$, because the masking signal X forces the output of the AND-gate G1 to a low level.

The timer circuit TMR may also trigger the switch-over from the reference voltage $V_R = V_{ON}$ to $V_R = V_{OFF}$, which is used by the comparator $CMP_1$. Basically, the switch-over is triggered upon activation of the SR flip-flop SR1, which is indicated by signal ON. However, the switch-over is delayed by a time $T_{MASK}$. Accordingly, the signal X may be combined with the output signal ON using AND-gate G2. Thus, the switch-over from $V_R=V_{ON}$ to $V_R=V_{OFF}$ is triggered by the output of AND-gate G2. In the present example, the switch-over from $V_R=V_{OFF}$ back to $V_R=V_{ON}$ may be triggered by the reset signal $\overline{C}$.

Figure 9:
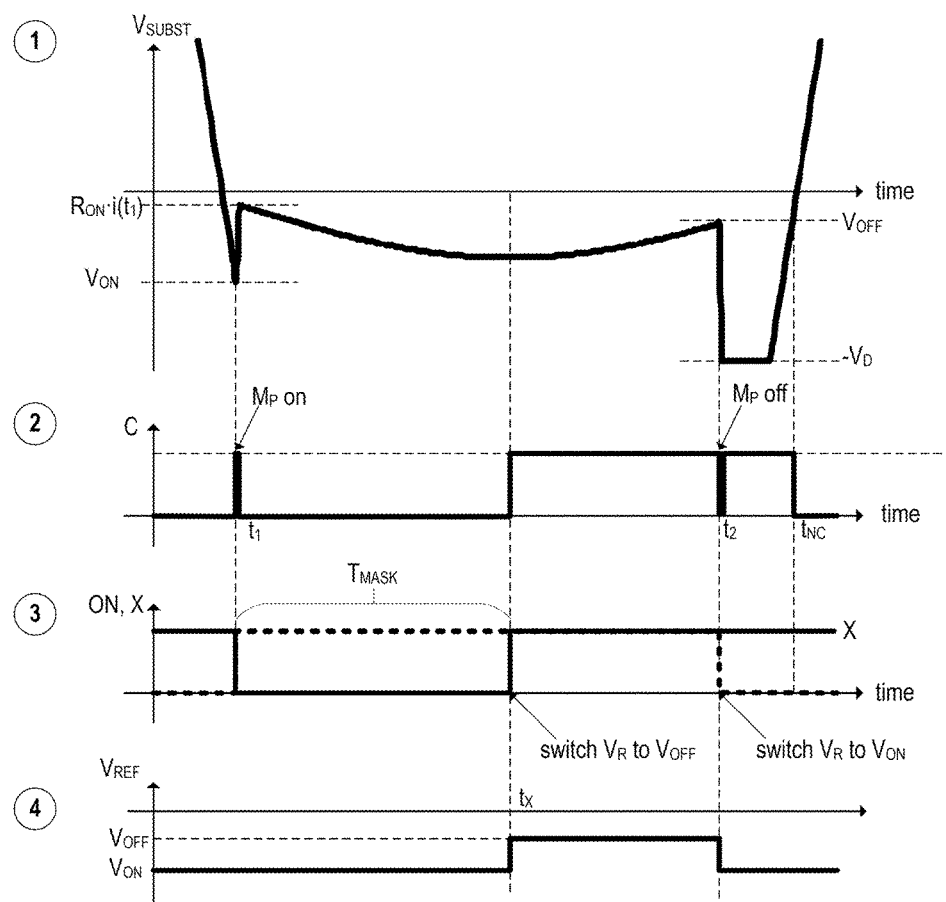
FIG. 9 includes four timing diagrams illustrating the function of the control logic of FIG. 8 in more detail.

The function of the exemplary control logic of FIG. 8 is further explained below with reference to the timing diagrams shown in FIG. 9. The first timing diagram of FIG. 1 is essentially the same as the top diagram of FIG. 7B and shows the second portion of a cycle, during which the substrate voltage $V_{SUBST}$ is negative. When the substrate voltage $V_{SUBST}$ becomes negative, it keeps falling until it reaches the comparator threshold voltage $V_R=V_{ON}$ at time instant $t_1$ (see first diagram of FIG. 9). At this time instant $t_1$ the comparator output of comparator $CMP_1$ (see FIG. 8) rises to a high level thus triggering the one-shot monoflop MF1, which generates a pulse to set the SR flip-flop SR1. The output signal ON of SR flip-flop SR1 is shown in the third diagram of FIG. 9 as dotted line. Upon activation of SR flip-flop SR1 the MOS channel of the transistor $M_P$ is activated via gate driver 13. As soon as the MOS channel is conductive, the substrate voltage $V_{SUBST}$ rises close to zero volts, i.e. to $R_{ON} \cdot i(t_1)$, wherein $i(t_1)$ is the load current at time $t_1$ an $R_{ON}$ the on-resistance of the MOS channel. The product $R_{ON} \cdot i(t_1)$ may be in the range of approximately 100 mV. Dependent on the implementation of the MOS transistor $M_P$, the load current, and the temperature this value may be lower or higher. As the substrate voltage $V_{SUBST}$ rises after $t_1$ the comparator output signal C again drops to a low level (see second diagram in FIG. 9), so that only a short pulse occurs at the comparator output at time $t_1$.

As mentioned above with regard to FIG. 8, the timer circuit TMR is triggered at time instant $t_1$ and outputs a masking signal X, which is at a low-level for a time span $T_{MASK}$ after time instant $t_1$ (until $t_X=t_1+T_{MASK}$)). At time $t_X$ the masking signal X (see third diagram of FIG. 9, solid line) rises again to a high level, and the output signal of gate G2 (logic conjunction X AND ON) is used to trigger the switch-over from the threshold voltage $V_R=V_{ON}$ to $V_R=V_{OFF}$, which is used by the comparator $CMP_1$. Thus, the comparator threshold voltage $V_R$ is switched a time span $T_{MASK}$ after activation of the MOS transistor $M_P$. The threshold voltage $V_{OFF}$ will be (negative but) close to zero volts and may therefore be higher than the first threshold voltage $V_{ON}$. In the present example, the comparator output signal C will rise front a low level to a high level at time $t_X$ when the comparator reference voltage $V_R$ is set from $V_{ON}$ to $V_{OFF}$. At time instant $t_2$, the substrate voltage $V_{SUBST}$ ($=R_{ON} \cdot i(t)$) between times $t_1$ and $t_2$) reaching the comparator threshold $V_R=V_{OFF}$ causes the comparator output signal C to drop to a low level, which triggers a reset of the SR flip-flop SR1 (see FIG. 8, the falling edge in signal C at time $t_2$ is converted to a rising edge by inverter 11) and switches the MOS transistor $M_P$ off. As a consequence, the load current $i(t_2)$ is taken over by the MOS transistor's intrinsic reverse diode $D_R$ and thus the substrate voltage $V_{SUBST}$ drops to a voltage $-V_D$, which is the negative forward voltage of the body diode Da ($-V_D \approx -600$ mV at room temperature). The time span between the switch-off of the MOS transistor $M_P$ (at time $t_2$) and the end of the cycle (the subsequent zero-crossing in the substrate voltage $V_{SUBST}$ is comparably short so that the energy dissipation is kept low).

Figure 10A:
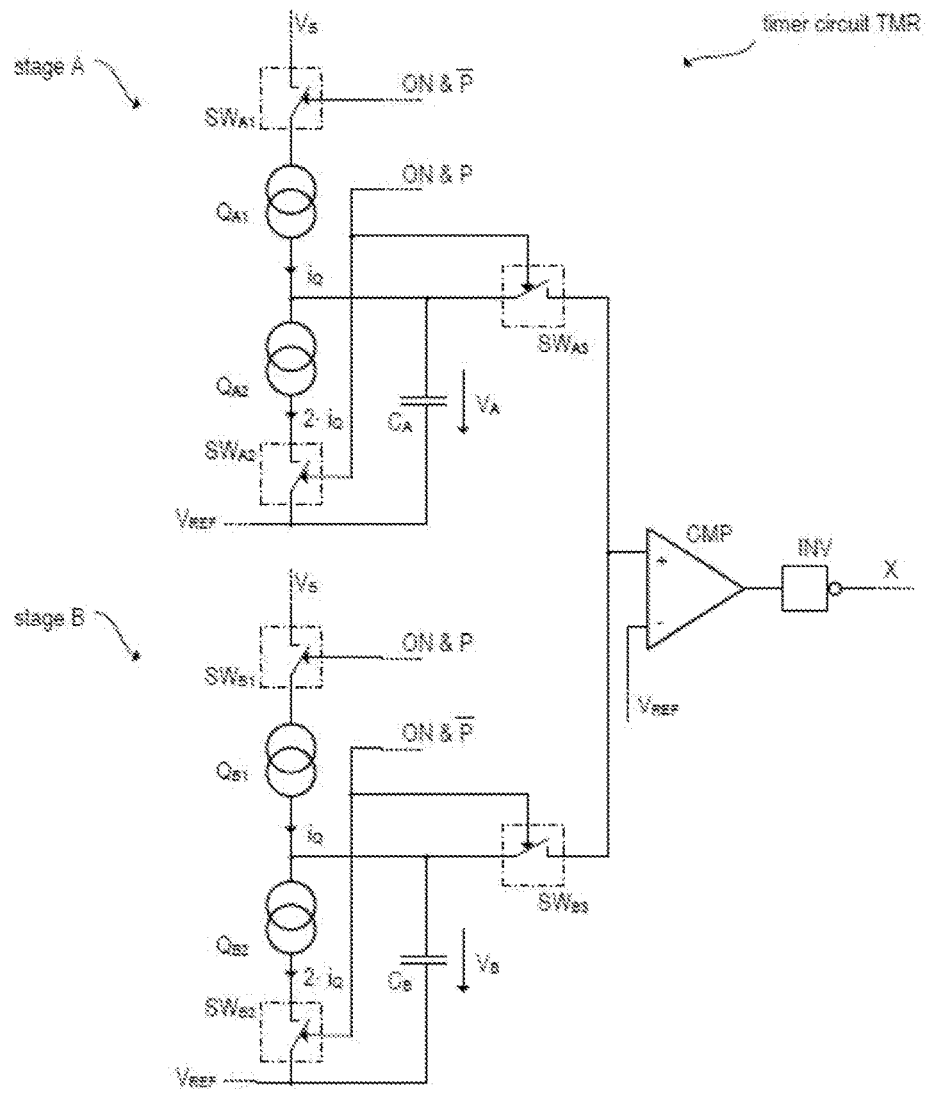
FIGS. 10A and 10B illustrate a timer circuit which may be used in the control circuit of FIG. 8 for masking an early switch-off of the MOSFET.
Figure 10B:
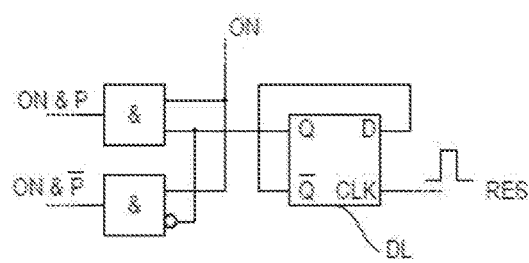

The cycle time of the substrate voltage $V_{SUBST}$ may depend on the application. When the AC voltage is provided by the electric power grid (e.g. via a transformer), the cycle time is substantially constant at approximately 20 ms (for 50 Hz AC voltage) or 16.7 ms (for 60 Hz AC voltage) or 60 ms (for 16.7 HZ AC voltage). In such applications, the time $T_{MASK}$ indicated by the timer circuit may be set to a constant value. However, in other applications such as in automobiles, the AC voltage may be generated, e.g., by an alternator, and the frequency of the AC voltage varies with the rotational speed of the alternator (which may be connected to the combustion engine of an automobile). In such applications it may be necessary to adjust the time $T_{MASK}$ dependent on the frequency or the cycle time of the AC voltage, which corresponds to the cycle time of the substrate voltage $V_{SUBST}$. FIGS. 10A and 10B illustrate one exemplary analog circuit which may be used to flexibly set the time span $T_{MASK}$ and thus the time instant $t_X$ (see FIG. 9), at which the threshold values are changed from $V_{ON}$ to $V_{OFF}$. It is understood that digital implementation with counters or integrators may be alternatives to the depicted analog implementation, and a person skilled in the art will readily be able to conceive various digital and analog implementations which basically provide the same function as the depicted example.

Generally, the masking circuit 110 is a sub-system configured to measure the length of the on-time $T_{ON}$ (see FIG. 7B) of the MOS transistor $M_P$ during a previous cycle of the substrate voltage $V_{SUBST}$. This measurement may be accomplished in various ways; it may be done digitally (e.g. using a counter) as well as analog (e.g. using an integrator). The output X of masking circuit 110 is at a low level ($\approx 0$V) between the switch-on of the MOS transistor $M_P$ (see, e.g., FIG. 9. time $t_1$) and approximately the 50 percent of the on-time time $T_{ON}$ of the MOS transistor $M_P$ during the previous cycle ($T_{MASK} \approx 0.5 \cdot T_{ON}$). This percentage may be different from 50 percent, dependent on the actual implementation. However, the masking time $T_{MASK}$ should be long enough to prevent an early switch-off of the MOS transistor $M_P$. It is understood that a ratio $T_{MASK}/T_{ON}$ of approximately 0.5 is merely an illustrative example. In other implementations, the ration may be lower or higher than 0.5. Furthermore, the ratio $T_{MASK}/T_{ON}$ may depend on the frequency of the substrate voltage $V_{SUBST}$ and thus on the rotational speed of the alternator. The ratio $T_{MASK}/T_{ON}$ may be chosen higher for higher alternator speeds.

As mentioned above, the masking circuit 110 prevents the power MOS transistor $M_P$ from switching off for a defined masking (blanking) time $T_{MASK}$. Nevertheless, in real applications (e.g. rectifying the voltage generated by an automotive alternator), undesired, abnormal situations may occur, in which the substrate voltage may become positive during the masking time $T_{MASK}$. In such situations, the masking circuit may be overridden (or deactivated) by a protection circuit, which is configured to switch-off the MOS transistor $M_P$ to avoid short-circuits.

The circuit of FIGS. 10A and 10B illustrate one exemplary implementation of the timer circuit used in the masking circuit 110 of the control logic shown in FIG. 8. FIG. 10A illustrates one exemplary implementation, which is substantially based on analog components and includes two substantially identical charging circuits (labeled "stage A" and "stage B"), which may be used to flexibly determine the time span dependent on the cycle time of the alternating substrate voltage $V_{SUBST}$. Each charging circuit include a capacitor $C_A$, $C_B$ that is charged by a constant current $i_Q$ for the time span $T_{ON}$ (see, FIG. 7B) in one cycle and discharged by a constant current $2 \cdot i_Q$ in the subsequent cycle. Thus, the time needed to discharge the capacitor $C_A$, $C_B$ determines the time span $T_{MASK}$, which is $T_{ON}/2$ since the discharging current is twice the charging current. As mentioned above, a discharging current different from $2 \cdot_Q$ (resulting in the mention ratio of 0.5) is possible. Generally a discharging current of $r \cdot i_Q$ would result in a ratio $1/r$. It is understood, that substantially the same function can be readily implemented using digital circuitry, such as, for example, counters or digital integrators, comparators, etc.

The capacitors $C_A$, $C_B$ are connected to current sources $Q_{A1}$, $Q_{A2}$ and, respectively $Q_{B1}$, $Q_{B2}$. Current sources $Q_{A1}$ and $Q_{B1}$ generate the charging current $i_Q$, whereas current sources $Q_{A2}$ and $Q_{B2}$ generate the discharging current $2 \cdot i_Q$. Each of the current sources $Q_{A1}$, $Q_{A2}$, $Q_{B1}$, and $Q_{B2}$ can be switched on and off by respective switches $SW_{A1}$, $SW_{A2}$, $SW_{B1}$, and $SW_{B2}$. The charging currents $i_Q$ are generated by current sources $Q_{A1}$ and $Q_{B1}$, whereas the discharging currents $2 \cdot i_Q$ are generated by current sinks $Q_{A2}$ and $Q_{B2}$. The two charging circuits operate in an alternating manner. That is, capacitor $C_A$ is charged during even cycles and discharged during odd cycles of the substrate voltage $V_{SUBST}$, whereas capacitor $C_B$ is charged during odd cycles and discharged during even of the substrate voltage $V_{SUBST}$. In the present example, signal P may be used to distinguish even cycles from odd cycles, wherein a high level (P=1) may indicate an odd cycle and a low level may indicate an even cycle. Further, the capacitors are only charged and discharged while the MOSFET $M_P$ is switched on, i.e. when signal ON is at a high level (ON=1, see FIG. 8). Accordingly, switches $SW_{A1}$ and $SW_{B2}$ are switched on while ON=1 and P=0 (logic conjunction ON & $\overline{P}$), whereas $SW_{A2}$ and $SW_{B1}$ are switched on while ON=1 and P=1 (logic conjunction ON & P). While the capacitors $C_A$, $C_B$ are discharged by the constant current $2 \cdot i_Q$, the respective capacitor voltage $V_A$ or $V_B$ is applied to the input of a comparator CMP via a further switch $SW_{A3}$ or $SW_{B3}$, respectively. The comparator CMP signals, at its output, a low level as soon as the capacitor $C_A$, $C_B$ is discharged, which is, in the present example, a time $T_{MASK}=T_{ON}/2$ after activation of the power MOSFET $M_P$. One can see that the time needed for discharging will always be half of the time needed fir charging (which is $T_{ON}$) regardless of the actual duration of the time span $T_{ON}$. Finally, the comparator output signal is inverted to generate the masking signal X, which exhibits a low level during the time span $T_{MASK}$ (see also FIG. 9).

FIG. 10B illustrates one example of aa circuit that may be used to generate the signal P. The example of FIGS. 10A and 10B includes basically a clocked D-latch which is connected to form a frequency divider. That is, the latch receives the reset signal RES as input signal at the clock input CLK, while the inverted latch output $\overline{Q}$ is fed back to the latch input D. The signal P is provided at the non-inverted latch output Q. Two AND-gates may be used to obtain the logic conjunctions ON & $\overline{P}$ and ON & P needed to control the switches $SW_{A1}$, $SW_{A2}$, $SW_{A3}$, $SW_{B1}$, $SW_{B2}$, $SW_{B3}$ as described above.

Figure 11:
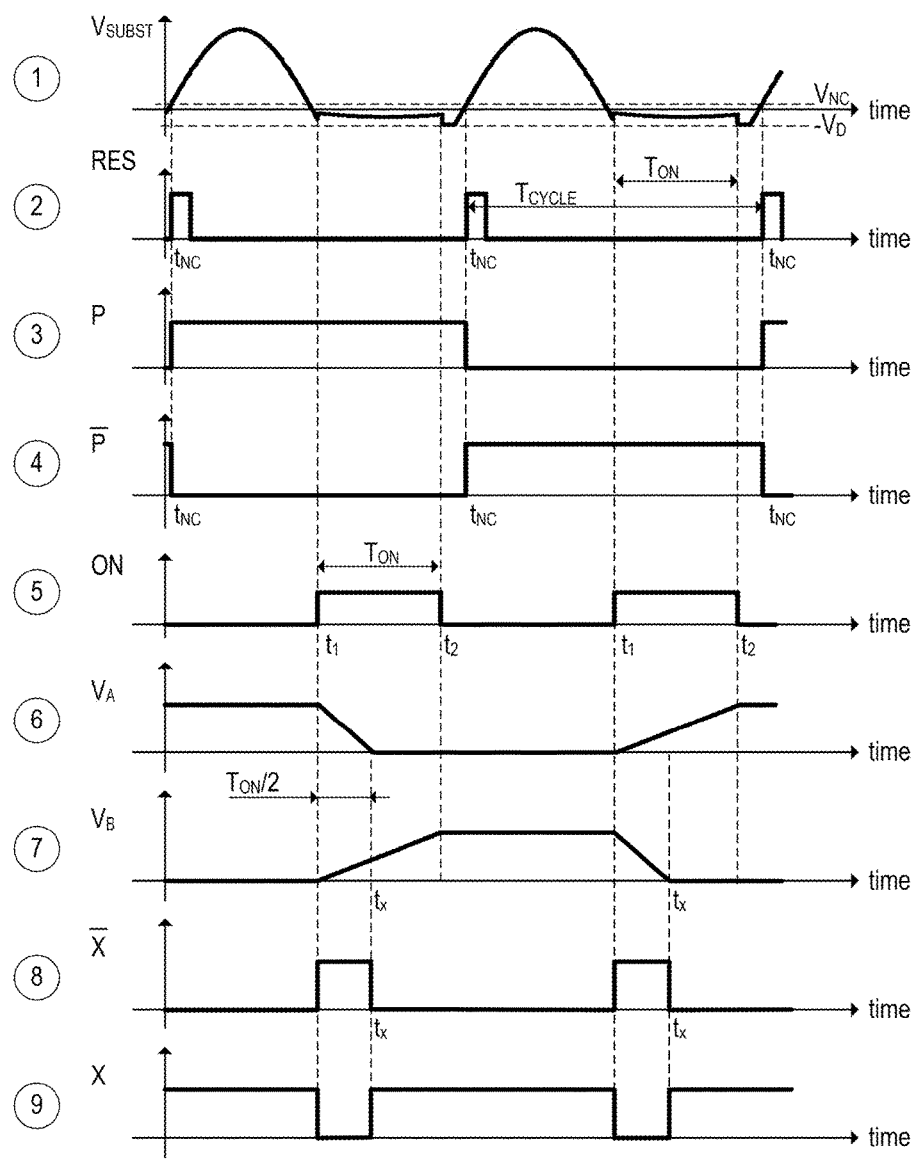
FIG. 11 includes timing diagrams illustrating the function of the timer circuit of FIGS. 10A and 10B in more detail.

The function of the exemplary timer circuit of FIGS. 10A and 10B (with a ratio $T_{MASK}/T_{ON} \approx 0.5$) is further illustrated by the timing diagrams shown in FIG. 11. The first timing diagram of FIG. 11 illustrates two cycles (cycle time $T_{CYCLE}$) of the alternating substrate voltage $V_{SUBST}$ (cf. FIG. 7A). The second timing diagram illustrates the corresponding reset signal, which exhibits a short reset pulse at each time instant $t_{NC}$, at which the substrate voltage exceeds the threshold voltage $V_{NC}$. In the present example, the threshold voltage $V_{NC}$ has a small positive value (e.g. 80 mV). However, the threshold voltage $V_{NC}$ may also be zero (see cycle detection circuit in FIG. 6). The third and the fourth timing diagrams of FIG. 11 illustrate the signal P and its inverse $\overline{P}$ as generated by the circuit shown in FIG. 10B. One can see, the period of signal P is $2 \cdot T_{CYCLE}$, and P exhibits a high level during odd cycles of the substrate voltage $V_{SUBST}$ and exhibits a low level during odd cycles. The fifth timing diagram of FIG. 11 illustrates the output signal ON of SR flip-flop SR1 (see FIGS. 8 and 9). The sixth and the seventh timing diagrams of FIG. 11 illustrate the capacitor voltages $V_A$ and $V_B$ across the capacitors $C_A$ and $C_B$, respectively. As explained above, the two capacitors $C_A$ and $C_B$ are charged and discharged in an alternating manner. That is, the two signal waveforms representing the capacitor voltages are time shifted with respect to each other by one period $T_{CYCLE}$. One can see that the capacitors $C_A$ and $C_B$ are charged for a time $T_{ON}$ (i.e. between the time instants $t_1$ and $t_2$) and discharged for a time $T_{ON}/2$ (i.e. between the time instants $t_1$ and $t_x$). The comparator output signal $\overline{X}$ is illustrated in the eighth timing diagram of and the masking signal X in the ninth timing diagram of FIG. 11. One can see that the masking signal X falls to a low level when the signal ON signals a switch-on of the power MOS transistor $M_P$ and returns to a high level after the masking time $T_{MASK}$, which equals $T_{ON}/2$ in the present example. As mentioned, different ratios may be applicable in other implementations.

Figure 12:
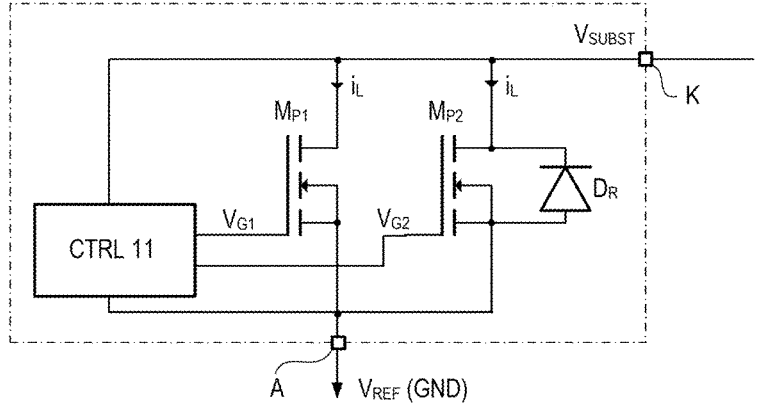
FIG. 12 illustrates an alternative to the example of FIG. 4, wherein two or more power MOSFETs are used instead of a single power MOSFET.

As mentioned above with respect to FIG. 3, the power MOS transistor $M_P$ may be an implemented as a vertical MOSFET that is composed of a plurality of transistor cells. That is, the source-drain current paths (or the emitter-collector current paths in case of an IGBT) of the individual transistor cells are connected in parallel to form the transistor $M_P$. To switch the transistor on and off the gate electrodes of all transistor cells are connected so that the gate electrodes are charged and discharges simultaneously. In the embodiments described below the rectifier device 10 includes two or more MOS transistors $M_{P1}$, $M_{P2}$, which are connected in parallel but have separate gate terminals. The MOS transistors $M_{P1}$, $M_{P2}$ may be formed by the transistor cells of a single cell array, wherein the gate electrodes of a first group of transistor cells are connected to the gate terminal of transistor $M_{P1}$ and the gate electrodes of a second group of transistor cells are connected to the gate terminal of transistor $M_{P2}$, while all transistor cells of the cell array share a common source electrode and a common drain electrode. In one example, the first group of transistor cells may include approximately 90 percent of the transistor cells of the cell array while the second group includes the remaining 10 percent. An example of such a rectifier device 10 with two power MOS transistors $M_{P1}$ and $M_{P2}$ is illustrated by the equivalent circuit in FIG. 12. Different from the example of FIG. 4, the control circuit 11 needs to generate two gate signals $V_{G1}$ and $V_{G2}$ instead of one to switch the transistors $M_{P1}$ and $M_{P2}$ on and off. The further description related to the example, in which two MOS transistors $M_{P1}$ and $M_{P2}$ are electrically connected in parallel as illustrated in FIG. 12. However, it is noted that a parallel circuit of three or more MOS transistors may also be used instead.

Figure 13:
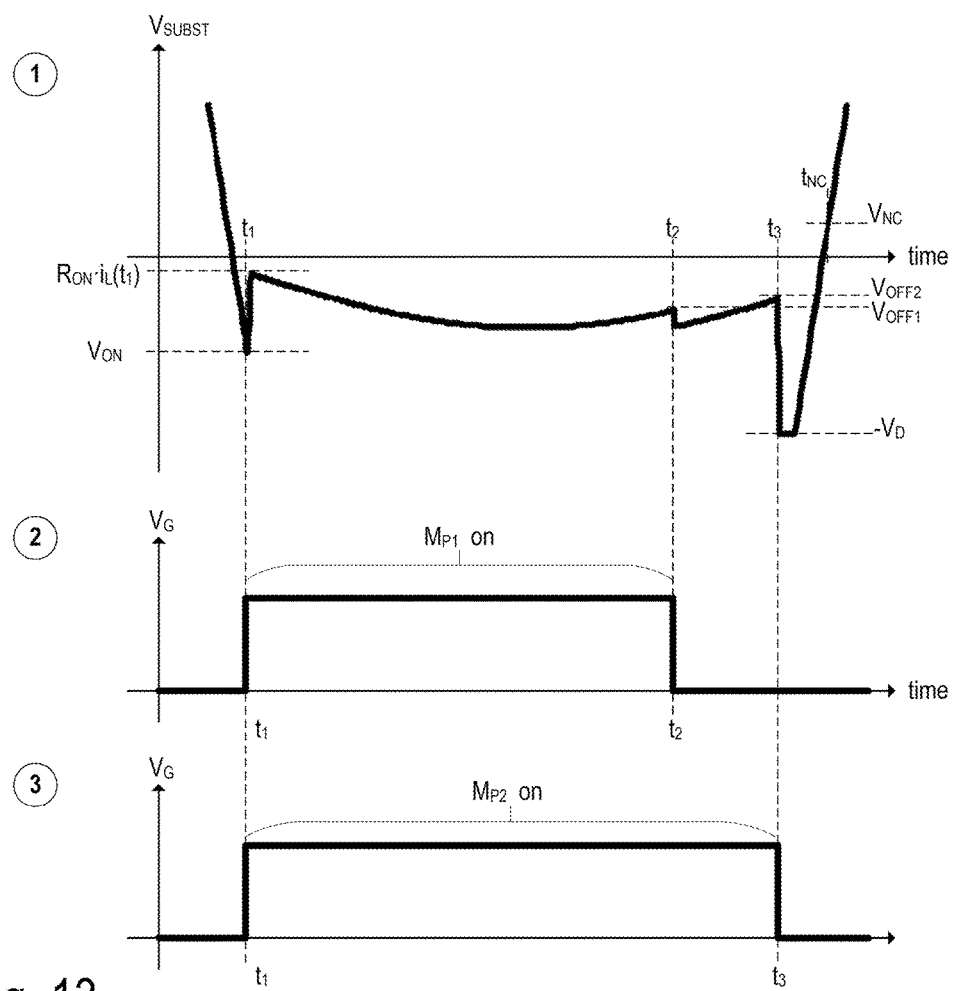
FIG. 13 includes timing diagrams illustrating the voltage drop across the rectifier device of FIG. 12, wherein—when activated—the MOS channels of both power MOSFETs bypass the body diode when the diode is forward biased and wherein the two power MOSFETs are switched of one after the other.

The timing diagrams of FIG. 13 illustrate one exemplary switching scheme for switching the MOS transistors $M_{P1}$ and $M_{P2}$ included in the rectifier device 10 of FIG. 12 on and off while the diode $D_R$ (which is the intrinsic body diode of transistors $M_{P1}$ and $M_{P2}$) is forward biased. Similar as in the example of FIG. 7B, both MOS transistors, $M_{P1}$ and $M_{P2}$, are switched on, when the control circuit 11 detects that the substrate voltage $V_{SUBST}$ is negative (i.e. the diode $D_R$ is forward biased). To determine the time instants for switching the MOS transistors $M_{P1}$ and $M_{P2}$ on and off negative threshold voltages $V_{ON}$, $V_{OFF1}$ and $V_{OFF2}$ may be used as explained below, Accordingly, both MOS transistors $M_{P1}$ and $M_{P2}$ are switched on, when the substrates voltage $V_{SUBST}$ reaches or falls below the first threshold $V_{ON}$. In the present example, the condition $V_{SUBST}=V_{ON}$ is fulfilled at time $t_1$ and the gate voltages $V_{G1}$ and $V_{G2}$ (see second and third diagram of FIG. 13) are set to a high level to switch on the MOS transistor $M_{P1}$ and $M_{P2}$. However, different from the example of FIG. 7B, only the first MOS transistor $M_{P1}$ is switched off again, when the substrate voltage $V_{SUBST}$ reaches or exceeds the second threshold $V_{OFF1}$ at the end of a cycle while the second MOS transistor $M_{P2}$ remains on. In the present example, the condition $V_{SUBST}=V_{OFF1}$ is fulfilled at time $t_2$ and the gate voltage $V_{G1}$ (see second diagram of FIG. 13) is set to a low level to switch the MOS transistor $M_{P1}$ off. When the MOS transistor $M_{P1}$ is switched off at time instant $t_2$, the substrate voltage $V_{SUBST}$ may abruptly fall to a lower level, as the overrall on-resistance $R_{ON}$ is increased due to the switch-off of those transistor cells which form the MOS transistor $M_{P2}$. However, as the load current $i_L$ decreases towards the end of the cycle, the substrate voltage keeps rising and the second MOS transistor $M_{P2}$ is eventually also switched off when the substrate voltage $V_{SUBST}$ reaches the third threshold level $V_{OFF2}$. As soon as both MOS transistors $M_{P1}$ and $M_{P2}$ are off the substrate voltage $V_{SUBST}$ may abruptly fall to $-V_D$ before it again rises to positive values at the beginning of the next cycle (reset pulse at time instant $t_{NC}$).

It is understood that a skilled person can find various other circuit implementations which substantially provide the same or a similar function. Therefore, it is emphasized that the implementation illustrated in FIG. 17 has to be regarded as an illustrative example only The same is true for the exemplary implementations of the control logic illustrated in FIGS. 8, 14, and 15. A skilled person will readily find various other implementations which provide substantially the same function as the depicted examples. In fact, the actual implementation may heavily depend on the semiconductor technology used to fabricate integrated circuits. Furthermore, it is understood that the depicted implementations are represented by simplified equivalent circuits, in which components, which are not needed to describe the example, have been omitted. Nevertheless, a skilled person will readily be able to implement the depicted examples in any suitable semiconductor technology.

One important application of a rectifier device as illustrated, e.g., in FIG. 4 is the rectification of the AC output voltage of an alternator. Particularly in automobiles, alternators are used to provide the on-board voltage supply of the automobile and to charge the automobile battery, which takes over the role as primary power supply when the engine is off and the alternator stands still (e.g. when the car is parked). When the alternator stands still and no AC voltage is generated, a rectifier device (cf. FIG. 4) coupled between the alternator phase terminal and the automobile battery "sees" a DC voltage $V_{DC}'$, which may have any level between zero and battery voltage. That is, when the alternator is in stand-by mode, the electronic circuitry in the rectifier device and, particularly, the control circuit 11 (see FIG. 4) is supplied by the battery. In other words, the current consumption of the rectifier devices loads the battery when the alternator is in stand-by mode.

Figure 14:
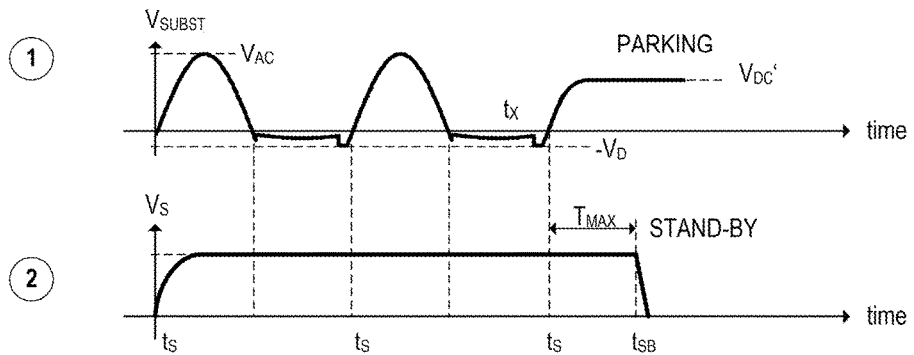
FIG. 14 includes timing diagrams illustrating the pulsating supply voltage available tor supplying, e.g., a control circuit as included in rectifier device of FIG. 4.

FIG. 14 is a timing diagram illustrating the alternating substrate $V_{SUBST}$ voltage during operation (cf., e.g., FIGS. 7A and 7B) of the alternator and when the alternator stops as well as a diagram illustrating the voltage $V_S$ provided by supply circuit 12 (see FIG. 6) to supply other circuitry in the rectifier device, e.g. the control logic (see FIG. 8) included in the control circuit 11. One can see from FIG. 1 that— when the alternator has stopped—the parallel circuit formed by diodes $D_1$ and $D_2$ will be connected in series to the parallel circuit formed by diodes $D_3$ and $D_4$. The battery voltage $V_{DC}$ drops across this series circuit and each diode (theoretically) "sees" a voltage of $V_{DC}'=V_{DC}/2$. However, the voltage $V_{DC}'$ can deviate from the theoretic value $V_{DC}/2$ because the diodes are not exactly identical (due to tolerances), Nevertheless, the battery will be loaded with some quiescent current consumed by the control circuit 11 included in the rectifier devices 10. The following examples relate to stand-by detection circuits, which are configured to detect that the alternator has stopped (e.g. at time $t_S$) and to disconnect (e.g. at time $t_{SB}$) the control circuit 11 (and optionally further circuitry included in the rectifier device 10) from the battery upon detection that the alternator has stopped. The second, timing diagram of FIG. 14 illustrates the resulting supply voltage $V_S$ generated by, e.g., the supply circuit 12 (see FIG. 6) and used by the control logic (see, e.g., FIG. 8) included in the control circuit 11.

Figure 15:
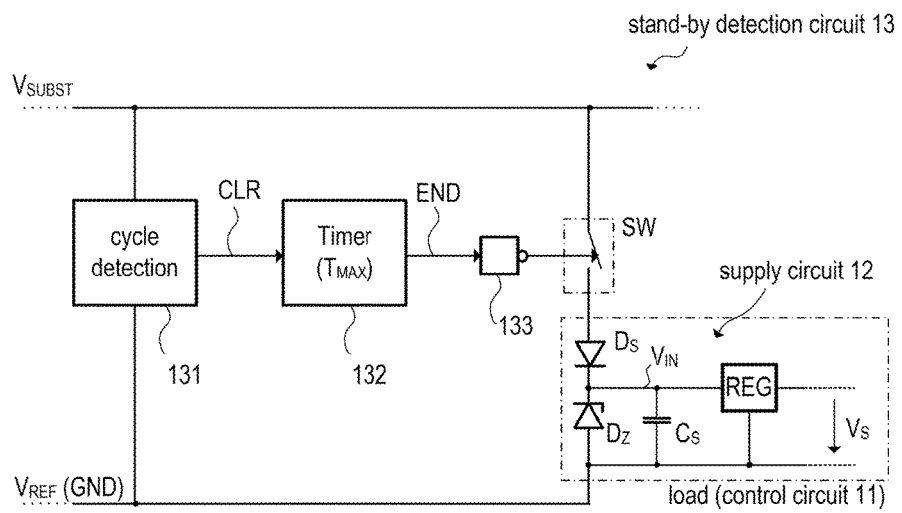
FIG. 15 is one exemplary stand-by detection circuit that may switch on/off control circuit included in the rectifier device of FIG. 4 or 12, when the AC power source (e.g. an alternator) is in stand-by mode.

FIG. 15 illustrates a general example of a stand-by detection circuit 13. Accordingly, the stand-by detection circuit 13 includes a cycle detection circuit 131 that is configured to detect a new cycle of the alternating substrate voltage $V_{SUBST}$. The cycle detection circuit 131 signals at its output (output signal CLR) that a new cycle has of the substrate voltage $V_{SUBST}$ has been detected. If the alternator has stopped, a new cycle cannot be detected. In this case the stand-by detection circuit 13 disconnects the control circuit 11 (including the supply circuit 12 generating the internal supply voltage $V_S$) from the substrate after a specific time. This time may be determined by timer circuit 132, which is also included in the stand-by detection circuit 13 and coupled to the output of the cycle detection circuit 131. Each time a new cycle of the substrate voltage $V_{SUBST}$ is detected, timer circuit 132 is reset, e.g. by the signal CLR, before a maximum time $T_{MAX}$ has lapsed. In absence of a reset, the timer generates a stand-by signal END after the maximum time $T_{MAX}$ has lapsed since the last reset. The stand-by signal my (directly or indirectly) trigger the disconnection of the supply line between substrate and control circuit 11 (and, where appropriate, further circuitry) thus reducing the current consumption during stand-by of the alternator. In the present example, the signal END triggers (via inverter 133) the opening of switch SW. Switch SW is open while the signal END is at a high level (and the inverse $\overline{END}$ at a low level) and closed while the signal END is at a low level (and the inverse $\overline{END}$ at a high level).

Figure 16:
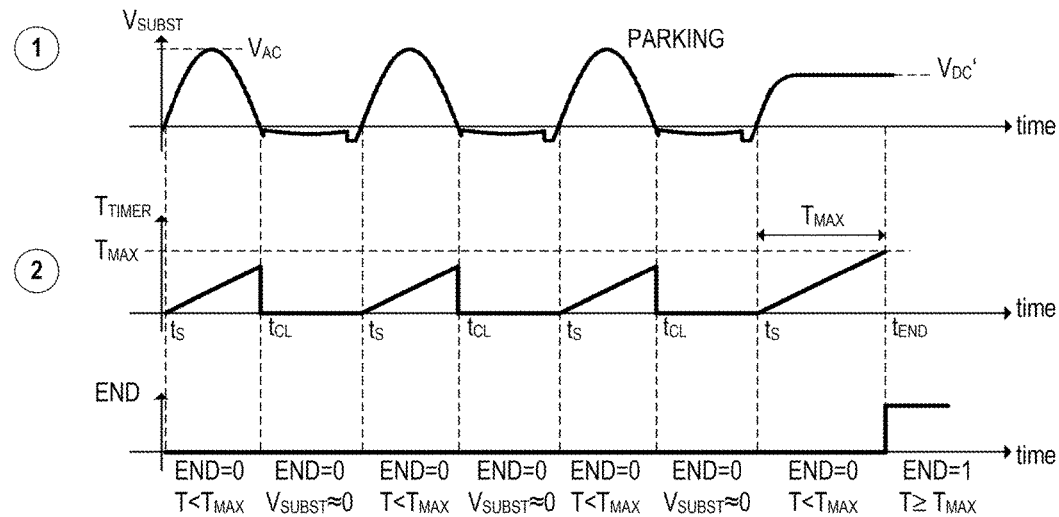
FIG. 16 is one exemplary timing diagram illustrating the general function of the standby detection circuit of FIG. 15.

FIG. 46 includes three timing diagrams illustrating the general function of the example circuit of FIG. 15. The first (top) timing diagram in FIG. 16 illustrates the oscillating substrate voltage $V_{SUBST}$ similar as in FIG. 14. The time instants $t_S$ denote those time instants, at which the cycle detection circuit 131 detects a new cycle of the substrate, voltage $V_{SUBST}$. For example, a new cycle may be detected each time the substrate voltage $V_{SUBST}$ becomes positive. The second (middle) timing diagram of FIG. 16 illustrates the operation of the timer 132. Basically, the timer operates similar to a stop watch. Accordingly, the timer is started at time instants $t_S$, i.e. upon detection of a new cycle of the substrate voltage $V_{SUBST}$. The timer is stopped and reset at time instants um when the substrate voltage becomes again negative. The maximum time $T_{MAX}$ is chosen so high that, during normal operation, the timer never reaches the maximum time $T_{MAX}$. As can be seen in the second timing diagram of FIG. 16, the timer is always reset before reaching the maximum time $T_{MAX}$ in the first three cycles shown in the diagram. As mentioned, the substrate voltage will remain at a positive DC level $V_{DC}'$ when the AC voltage source (e.g. the alternator of an automobile) stops rotating, e.g. when the automobile is parked and the combustion engine is switched off. In this case, the cycle detection circuit 131 will not trigger a further reset and restart of the timer and the timer will continue to be active until the time $T_{MAX}$ is reached. When the timer 132 reaches the maximum time $T_{MAX}$ (due to a missing reset), the stand-by signal END is set to a high level (d.h. END=1), which eventually triggers the disconnection of the supply line from the substrate, e.g. by opening switch SW (see FIG. 15).

Figure 17:
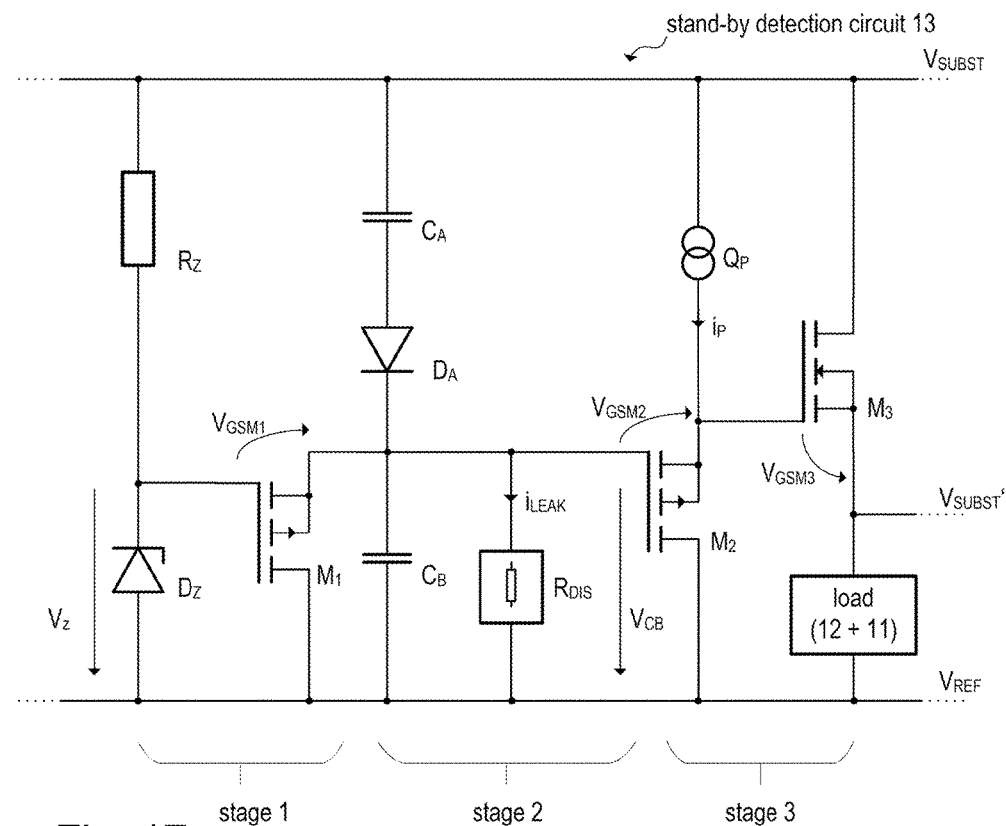
FIG. 17 illustrates one exemplary implementation of the example of FIG. 15
Figure 18:
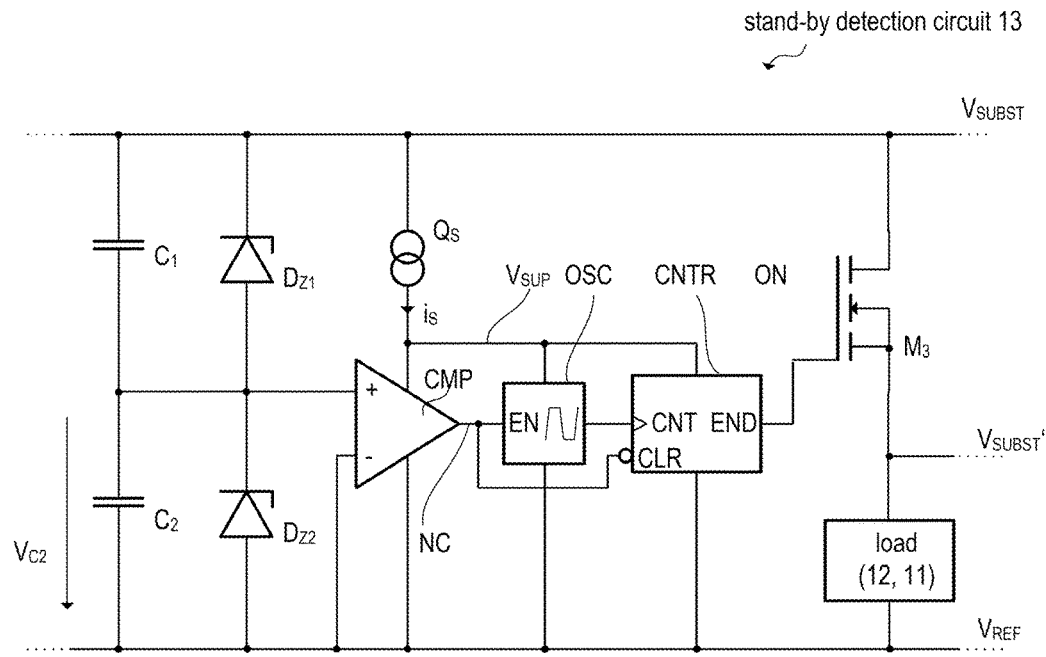
FIG. 18 illustrates another exemplary implementation that may be used as an alternative to the example of FIG. 17.
Figure 20:
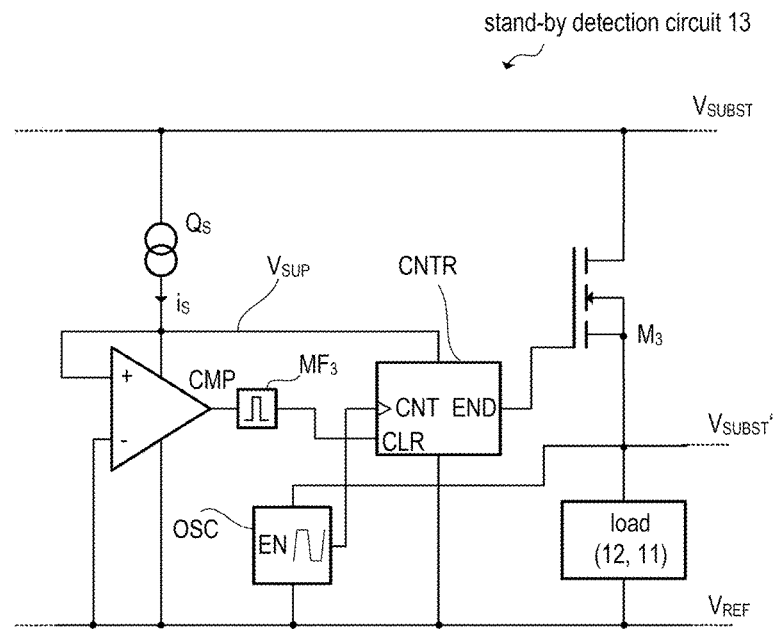
FIG. 20 illustrates a further exemplary implementation that may be used as an alternative to the example of FIG. 18.

The cycle detection and the timer may be implemented in various ways. Also the timing diagrams of FIG. 16 have to be regarded merely as an example, as many implementations exist to achieve basically the same function, The example of FIG. 17 illustrates an analog implementation, whereas the examples of FIGS. 18 and 20 illustrate digital implementations. In an analog implementation, the timer circuit may be implemented using a capacitor which is discharged via a resistive circuit so that the maximum time $T_{MAX}$ is basically determined by the time constant of an RC circuit. A reset of the timer circuit may be accomplished by recharging the capacitor in each cycle of the substrate voltage $V_{SUBST}$. In a digital implementation, the timer may be implemented using an oscillator and a counter, which counts the consecutive pushes generated by the oscillator. In this case, the timer may be reset simply by clearing (resetting) the counter value when the substrate voltage rises at the beginning of a cycle.

FIG. 17 illustrates one exemplary analog implementation of the stand-by detection circuit 13 that may disconnect the control circuit 11 included in the rectifier devices of FIG. 4 or 12 from the substrate, when the AC power source (e.g. the alternator of an automobile) stops or pauses. When the AC power source leaves resumes operation (e.g. when the alternator again generates an AC voltage) the stand-by detection circuit reconnects the control circuit 11 with substrate thus allowing supply current to pass from the substrate to the control circuit 11. As illustrated in the example of FIG. 17, the stand-by detection circuit 13 may include three stages (labelled "stage 1", "stage 2", and "stage 3") wherein each stage is coupled between the substrate (substrate voltage $V_{SUBST}$) and reference potential $V_{REF}$ (e.g. at the source terminal of the power MOSFET, see FIG. 4). The substrate voltage $V_{SUBST}$ periodically rises and falls as illustrated, for example in FIG. 7A and FIG. 15.

According to the exemplary analog implementation illustrated in FIG. 17 three transistors $M_1$, $M_2$, and $M_3$ are employed, each one operating as a source follower. The first stage is basically a clamping circuit that is configured to limit the voltage $V_{CB}$ across a capacitor $C_B$ (included in the second stage) to a desired maximum voltage and thus also defines the level of the voltage $V_{SUBST}'$ which is available for the load (e.g. circuits 12 and 13). Accordingly, the clamping circuit includes a series circuit of resistor $R_Z$ and a Zener diode $D_Z$ (Zener voltage $V_Z$), which is coupled between substrate (substrate voltage $V_{SUBST}$) and reference (ground) potential $V_{REF}$, and a MOS transistor $M_1$ that is controlled by the voltage at the common circuit node between Zener diode $D_Z$ and resistor $R_Z$. The drain of the MOS transistor $M_1$ is at reference potential $V_{REF}$, and the source of the MOS transistor $M_1$ is connected to the mentioned capacitor $C_B$. That is, the source-drain current path of MOS transistor $M_1$ and capacitor $C_B$ are connected in parallel. The source-gate-voltage of MOS transistor $M_1$ equals $V_{CB} - V_Z$. From FIG. 13 one can see that, if the capacitor voltage $V_{CB}$ reaches $V_{TH} + V_Z$ ($V_{TH}$ being the threshold voltage of MOS transistor $M_1$), MOS transistor $M_1$ will become conductive and, as a consequence, discharges via the source-drain current path of MOS transistor $M_1$ until the capacitor voltage falls below $V_{TH} + V_Z$, which causes MOS transistor $M_1$ to block and stop the discharging. This mechanism effectively limits the capacitor voltage to a maximum voltage, which corresponds to approximately $V_{TH} + V_Z$. In view of the above explanation, the voltage $V_{SUBST}'$ equals $V_Z + V_{GSM1} + V_{GSM2} - V_{GSM3}$, wherein $V_{GSM1}$ denotes the gate-source voltage of p-channel transistor $M_1$, $V_{GSM2}$ denotes the gate-source voltage of p-channel transistor $M_2$, and $V_{GSM3}$ denotes the gate-source voltage of n-channel transistor $M_3$. As mentioned, modifications or enhancements of the present circuit may be made. For example, the clamping circuit may be replaced by a simple Zener diode coupled in parallel to capacitor $C_B$.

The second stage basically implements the cycle detection circuit 131 and the timer circuit 132 illustrated in the general example of FIG. 15. Accordingly, the second stage includes a series circuit of capacitor $C_B$, a further capacitor $C_A$, and a diode $D_A$. The series circuit is connected between substrate (substrate voltage $V_{SUBST}$) and reference potential $V_{REF}$, wherein capacitor $C_B$ is connected to a circuit node providing reference potential $V_{REF}$, capacitor $C_A$ is electrically connected to substrate, and diode $D_A$ is connected between the two capacitors $C_A$, $C_B$. In essence, the two capacitors $C_A$, $C_B$ form a capacitive voltage divider, wherein diode $D_A$ prevents capacitor $C_B$ from being discharged via the substrate during the phases, in which the substrate voltage is zero or close to zero (see, e.g. FIG. 7A). The second stage further includes a discharging circuit $R_{DIS}$ connected in parallel to capacitor $C_B$. In the present example, the discharging circuit may be a simple resistor or a reverse biased diode (so that only leakage current passes the diode). Other circuit components may be used in the discharging circuit. In a simple alternative, the discharging circuit may be a simple resistor. As long as the substrate voltage $V_{SUBST}$ alternates between approximately zero and $V_{AC\_MAX}$ (see FIG. 7A), the capacitor $C_B$ is recharged in every cycle and the capacitor voltage $V_{CB}$ is maintained at substantially constant level. When the alternator stops generating an AC voltage, the substrate voltage $V_{SUBST}$ stops alternating and the (constant) DC voltage $V_{DC}'$ is applied to the substrate (see FIG. 14) as mentioned above. As a consequence, capacitor $C_B$ will not be cyclically recharged anymore and is able to gradually discharge through the discharging circuit $R_{DIS}$ wherein the discharging current is a small (e.g., leakage) current $i_{LEAK}$ passing through the discharging circuit. As a result, the capacitor voltage $V_{CB}$ will gradually fall to zero. The capacitor voltage $V_{CB}$ may be regarded as output of the second stage and input of the third stage.

The third stage may be regarded as a switching circuit (cf. FIG. 15, switch SW) that is configured to disconnect the circuits to be supplied via the substrate (i.e. supply circuit 12 and control circuit 11, see FIGS. 4, 6 and 12). In the present example, the third stage includes a MOS transistor $M_3$ which is connected in the supply path of aa load, so that—during normal operation when transistor $M_3$ is on and conductive—the load draws supply current via transistor $M_3$. The load is also coupled to a circuit node at reference potential $V_{REF}$ so that the load current can be drained to ground via that circuit node. In the present example, the transistor $M_3$ is an n-channel MOSFET. The gate of transistor $M_3$ may be charged by a current source $Q_P$ that is configured to charge the gate until the gate-source voltage $V_{GS}$ exceeds the transistor's threshold voltage so that the transistor $M_3$ is in a conductive state (basically transistor $M_3$ is operated as a source -follower), A further transistor $M_2$, which is a p-channel MOSFET in the present example, may be coupled between the gate of transistor $M_3$ and reference potential $V_{REF}$ so that the gate of transistor $M_3$ can discharge (thus switching transistor $M_3$ off) via the source-drain current path of transistor $M_2$ if transistor $M_2$ is switched on. During normal operation, transistor $M_2$ receives, as gate voltage, capacitor voltage $V_{CB}$, which is high enough to switch the transistor $M_2$ off. However, if the alternator stops, the capacitor voltage $V_{CB}$ gradually drops to zero (clue to discharging of the capacitor $C_B$ with a specific time constant). At some point the falling capacitor voltage $V_{CB}$ will activate transistor $M_2$, which will cause activation of the source-drain current path of transistor $M_2$, through which the gate of transistor $M_3$ can now be discharged. As a result, the voltage $V_{SUBST}'$ is approximately zero because capacitor voltage $V_{CB}$ drops to approximately zero volts as capacitor $C_B$ discharges. As a consequence, the equation $V_{SUBST}'=V_{GSM2}-V_{GSM3}\approx 0V$ holds true, Effectively, the supply line of the load (circuit 11 including supply circuit 12) is disconnected from the substrate. If the alternator is started again and generates an alternating voltage supplied to the substrate, the capacitor $C_B$ can again be recharged as mentioned above and, as a result, the capacitor voltage $V_{CB}$ again rises, which eventually switches transistor $M_2$ off and transistor $M_3$ on, so that the load is again connected to substrate. It is understood that the transistor $M_3$ provides the function of switch SW in the general example of FIG. 15.

The mentioned load may be, for example, the supply circuit 12 (see FIG. 6) that generates the internal supply voltage $V_S$ for the control logic included in control circuit 11. It is noted that the Zener diodes included in the circuit of FIG. 17 may also, be implemented using one or mode MOS structures (e.g. MOS transistors connected as MOS diodes). Although such MOS structures are physically not the same as a Zener diodes, they, nevertheless, behave like Zener diodes and thus are considered as Zener diodes herein. Such implementations, which depend on the manufacturing technology used for fabricating integrated circuits, are as such known and thus not further explained here. Although the transistors used in the circuit of FIG. 17 are implemented as MOS transistors, other types of transistors may be used instead (e.g. bipolar junction transistors).

FIG. 18 illustrates an exemplary digital implementation of the general circuit of FIG. 15. Similar to the previous example, the circuit of FIG. 14 includes a capacitive voltage divider composed of capacitors $C_1$ and $C_2$, which are connected in parallel between substrate (substrate voltage $V_{SUBST}$) and reference potential $V_{REF}$. To limit the capacitor voltages, each of the both capacitors $C_1$ and $C_2$ has a Zener diode coupled in parallel (diode $D_{Z1}$ and $D_{Z2}$, respectively). Dependent on the actual implementation the Zener diodes may be optional. However, Zener diodes may be needed in view of production tolerances of the capacitors (and thus of the voltage division ratio). While the alternator is active and generates an AC voltage, the substrate voltage $V_{SUBST}$ as well as the capacitor voltage $V_{C2}$ will also cyclically rise and fall synchronously to the AC voltage generated by the alternator. When the alternator stands still, the substrate voltage $V_{SUBST}$ will remain at the DC voltage $V_{DC}'$ (cf. FIG. 14) and the capacitor voltage $V_{C2}$ will assume a constant level between the voltage $V_{DC}'$ and reference voltage $V_{REF}$, dependent on the division ratio of the capacitive voltage divider $C_1$, $C_2$. A comparator CMP is coupled to the capacitor $C_2$ so that it can compare the capacitor voltage $V_{C2}$ with a threshold that, in the present example, may be set to the reference potential $V_{REF}$ (e.g. inverting, input of comparator CMP is supplied with $V_{REF}$, non inverting input of comparator CMP is supplied with $V_{REF}$). Accordingly, the comparator output is at a high level when $V_{C2}>V_{REF}$ and is at a low level, when $V_{C2}<V_{REF}$. That is, a falling edge occurs in the comparator output signal when the substrate voltage $V_{SUBST}$ falls below the reference voltage $V_{REF}$ (see FIG. 7B, zero crossing before time instant $t_1$). Similarly, a rising edge occurs in the comparator output signal when the substrate voltage $V_{SUBST}$ exceeds the reference voltage $V_{REF}$.

The circuit of FIG. 18 also includes an oscillator OSC, which may be a simple digital oscillator, e.g. a relaxation oscillator. However, other types of oscillators may also be applicable, The comparator output signal is supplied to an enable input EN of the oscillator OSC so that the oscillator OSC starts to generate repetitive pulses at its output as soon as the comparator output generates a high level. This condition occurs, when the voltage $V_{C2}$ is lower than voltage at the non-inverting input of the comparator, which may be connected to a reference voltage such as, for example, the reference voltage $V_{REF}$ (ground). A digital counter CNTR receives the oscillator output signal at its counter input CNT to count the repetitive pulses. The digital counter CNTR is reset (cleared) in response to a falling edge (or a low level) of the comparator output signal NC (e.g. when $V_{C2}$ again falls below $V_{REF}$). In essence, the counted number of pulses represents the time span, for which the substrate voltage $V_{SUBST}$ (and thus capacitor voltage $V_{C2}$) is above, for example, the reference voltage $V_{REF}$. A value different from $V_{REF}$ may be used.

When the alternator stops and changes in stand-by mode the substrate voltage $V_{SUBST}$ will remain at DC voltage $V_{DC}'$ as mentioned above, As a result, the counter will net be cyclically reset anymore and continuously count the pulses generated by the oscillator OSC until a maximum counter value is reached. At that time instant, the counter CNTR will signal a stand-by signal END at its output, which may be supplied to the control electrode (e.g. gate electrode) of transistor $M_3$. As in the previous example of FIG. 17, the source-drain current path of transistor $M_3$ may be coupled between substrate and a load. In the present example, the transistor $M_3$ may be an n-channel MOS transistor and configured to disconnect the load from the supply in response to the counter CNTR signaling that the counter value reached a specific maximum. Comparator CMP, oscillator OSC and counter CNTR are supplied by a current source $Q_S$ (implemented, e.g. using a transistor). Accordingly, the current source $Q_S$ is coupled between substrate and the components to be supplied.

Figure 19:
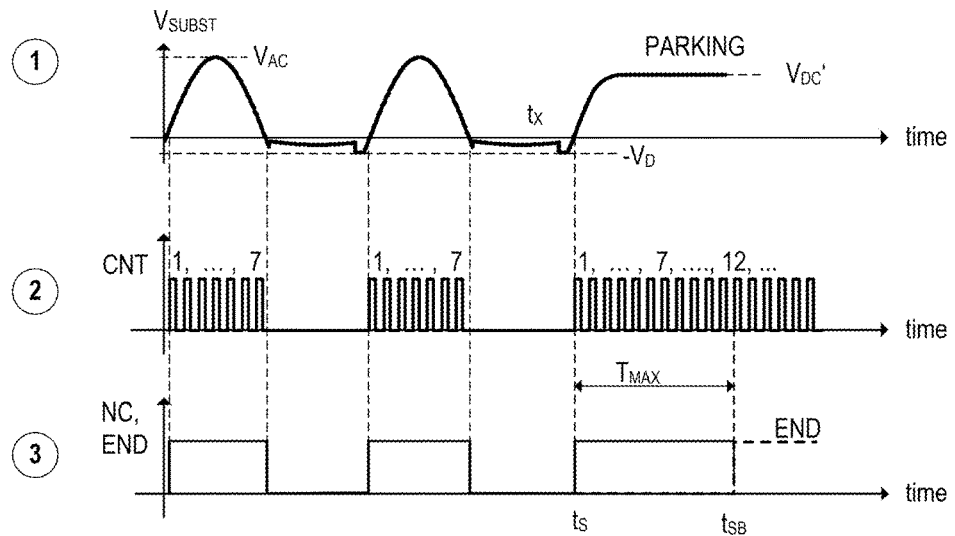
FIG. 19 includes timing diagrams for illustrating the function of the example of FIG. 18.

The basic function of the circuit of FIG. 18 illustrated by the timing diagrams in FIG. 19. The top timing diagram of FIG. 19 is the same as in FIG. 14 and the respective explanation is thus not repeated here. The middle timing diagram illustrates the repetitive pulses generated by oscillator OSC and counted by counter CNTR when (and as long as) the substrate voltage $V_{SUBST}$ is above the, reference voltage $V_{REF}$. The bottom timing diagram illustrates—as solid line—the comparator output signal NC (supplied to the counter reset input CLR). Accordingly, the counter is reset when the substrate voltage $V_{SUBST}$ is below the reference voltage $V_{REF}$ and signal NC changes to a low level. In the present example, the counter CNTR is reset after the seventh pulse. When the alternator stops, the substrate voltage $V_{SUBST}$ remains at DC voltage $V_{DC}'$ and does not alternate anymore. As a consequence, the counter CNTR keeps on counting the repetitive pulses and signals a stand-by signal (dashed line in the bottom diagram of FIG. 19) when the counter value reaches a specific maximum (which is twelve in the present example), The stand-by signal END eventually triggers the disconnection of the load from the supply as explained above.

Although the two examples of FIGS. 17 and 18 are different with regard to their specific implementation, the function provided by the two examples is basically the same: In both cases some circuitry is provided to detect a new cycle of the substrate voltage $V_{SUBST}$, and in each detected cycle, a timer circuit is "reset". When the alternator stops, the alternation of the substrate voltage $V_{SUBST}$ also stops, and thus the timer circuit is not reset any more. When a timer is active for a specific maximum time (without a reset) then the load is disconnected from the substrate. As mentioned, the load may be the supply circuit 12 (see FIG. 6) and the control circuit 11 (see FIG. 4 and 12), which have both been explained already.

Figure 21:
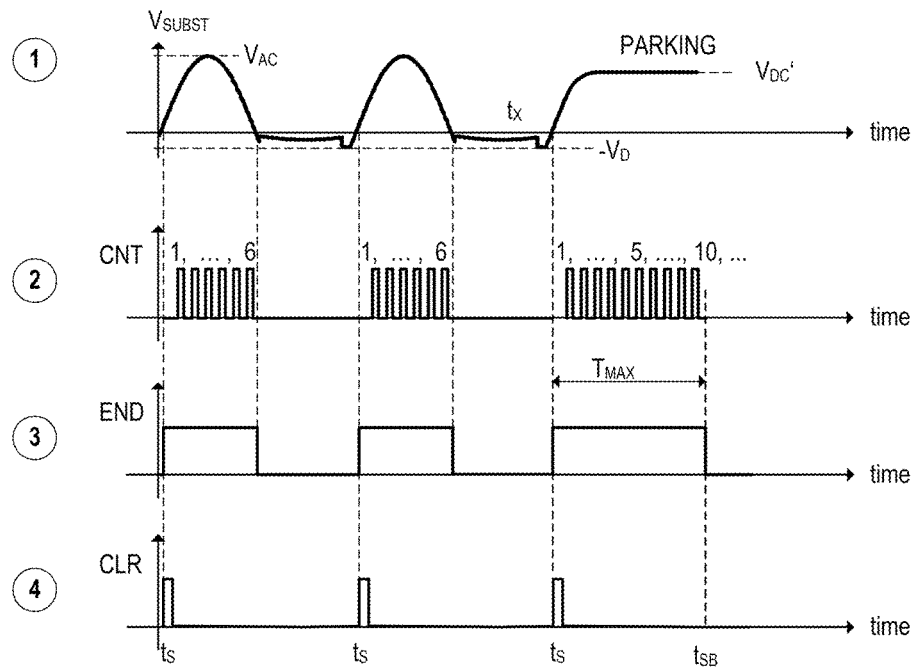
FIG. 21 includes timing diagrams for illustrating the function of the example of FIG. 20.

FIG. 20 illustrates a further example of a digital implementation of the stand-by detection circuit 13, which is similar to the implementation of FIG. 18. However, a capacitive voltage divider is not needed and the oscillator OSC is also switched off when the counter CNTR is not reset within the time span $T_{MAX}$. FIG. 21 includes timing diagrams for illustrating the function of the circuit of FIG. 20. Similar to the example of FIG. 18, the current example includes a comparator CMP which receives the reference voltage $V_{REF}$ and a supply voltage $V_{SUP}$ as input signals, wherein the supply voltage $V_{SUP}$ is generated based on the substrate voltage $V_{SUBST}$ and thus only available while the substrate voltage $V_{SUBST}$ is sufficiently high (e.g. above a few volts). That is, each time the substrate voltage $V_{SUBST}$ rises (positive half-waves, see first diagram in FIG. 21), the supply voltage $V_{SUP}$ will also rise from zero to, for example, 3V. The comparator output will signal a high level that triggers the monoflop MF3, which thus generates a reset pulse at the beginning of each cycle of the substrate voltage $V_{SUBST}$ (see fourth diagram in FIG. 21, signal CLR). The reset of counter CNTR may also be implemented without the monoflop. In this case a level-sensitive counter instead of an edge-sensitive counter would be employed. The reset pulses are supplied to the reset input (labelled CFR) of the counter CNTR. Accordingly, the counter CNTR is reset at the beginning of each cycle of the substrate voltage $V_{SUBST}$ as long as the substrate voltage $V_{SUBST}$ alternates (i.e. during operation of the alternator). While the supply voltage $V_{SUP}$ is available (i.e. has a level sufficiently high to supply the counter CNTR, the comparator CMP and the monoflop MF3), the oscillator generates consecutive pulses provided to the CNT input of counter CNTR as in the previous example.

In the absence of a reset pulse—i.e. when the alternator has stopped—the counter CNTR counts up to a maximum counter value (see FIG. 21, second diagram) that corresponds to the maximum time $T_{MAX}$. Once the maximum counter value has been reached (i.e. the maximum time $T_{MAX}$ elapsed), the counter generates a stand-by signal END that changes from a high level to a low level at the end of the time span $T_{MAX}$ thus triggering a switch-off of transistor $M_3$ analogously to the previous example (see FIG. 21, third diagram). Different from the previous example, the oscillator OSC is not supplied by the voltage $V_{SUP}$ but rather via the transistor $M_3$, as a consequence, the oscillator OSC is not supplied and therefore draws no current during stand-by. The quiescent current consumption in standby mode is thus reduced to very low values.

Figure 22:
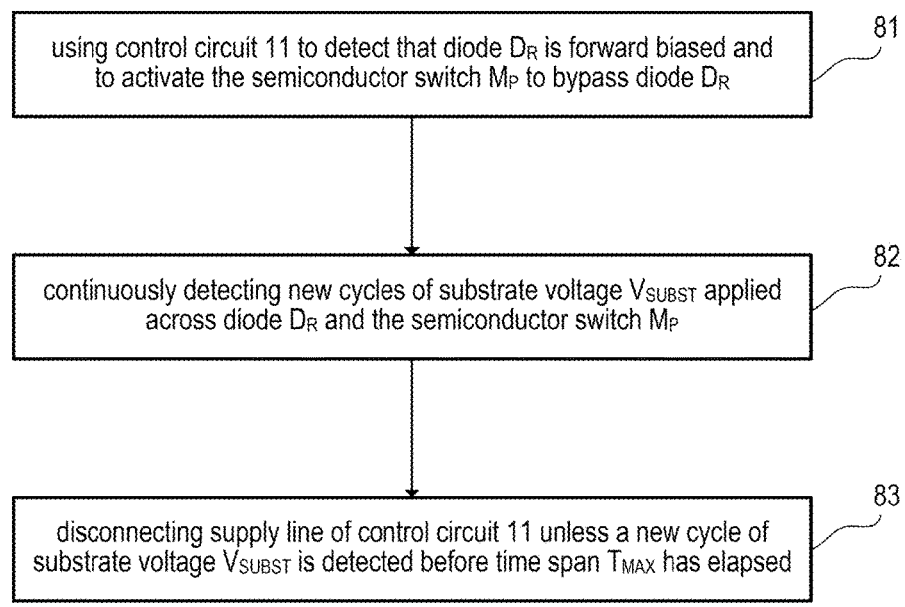
FIG. 22 is a flow chart illustrating one exemplary method of operating a rectifier device including the stand-by detection capability described herein.

FIG. 22 is a flow chart illustrating one exemplary method for operating a rectifier device. As described above with reference to FIGS. 1 to 21, the rectifier device 10 includes a semiconductor switch (e.g. power MOS transistor $M_P$, see FIG. 4, or power MOS transistors $M_{P1}$, $M_{P2}$, see FIG. 12) and a diode $D_R$ coupled in parallel between a first and a second terminal (i.e. anode and cathode terminal of diode $D_R$). According to the present example, the method includes using a control circuit (e.g., control circuit 11, see FIGS. 4 and 12) to detect that diode $D_R$ is forward biased and to activate semiconductor switch $M_P$ to bypass diode $D_R$ upon detection that the diode $D_R$ is forward biased (see FIG. 22, step 81). The method further includes continuously detecting new cycles (cf. signal CLR in FIG. 21) of an alternating input voltage (e.g. substrate voltage $V_{SUBST}$) applied across diode $D_R$ and the semiconductor switch $M_P$ (see FIG. 22, step 81). Furthermore, the method includes disconnecting a supply line of control circuit 11 unless a new cycle of the alternating input voltage is detected before a maximum time span (e.g. time span $T_{MAX}$, cf. FIG. 21) has elapsed (see FIG. 22, step 83).

Disconnecting the supply line of the control circuit may include resetting a timer (see, e.g., FIG. 15, timer 132) upon detection of a new cycle of the substrate voltage $V_{SUBST}$ and subsequently triggering disconnection (e.g. by opening switch SW, see FIG. 21) of the supply line, when the timer has not been reset for the maximum time span $T_{max}$. Resetting the timer may include generating consecutive pulses by an oscillator (see, e.g., FIG. 21, pulses at counter input CNT), counting the consecutive pulses by increasing a counter value, and rescuing the counter value (see, e.g., FIG. 21, reset pulses at counter input CLR) upon detection of a new cycle of the alternating input voltage.

Several aspects of the embodiments described herein are summarized below. It is noted, however, that the following summary is not an exhaustive enumeration of features but rather an exemplary selection of features which may be important or advantageous in some applications. in accordance with one example (Example 1), a rectifier includes a first MOS transistor, which has a load current path and a diode connected parallel to the load current path, wherein an alternating input voltage is operably applied across the load current path and the diode. The rectifier device further includes a control circuit that is configured to switch on the first MOS transistor for an on-time period, during which the diode is forward biased. A stand-by detection circuit includes a cycle detection circuit configured to detect cycles of the alternating input voltage and a timer that is coupled to the cycle detection circuit. The timer is configured to be reset by the cycle detection circuit upon detection of a cycle of the alternating input voltage, and to disconnect a supply line of the control circuit unless reset before a maximum time span has elapsed.

Example 2: The rectifier device according to example 1, further including a cathode terminal and an anode terminal, between which the alternating input voltage is applied, wherein a potential of the anode terminal serves as ground potential for the control circuit.

Example 3: The rectifier device according to example 2, wherein the supply line of the control circuit couples the cathode terminal with the control circuit, and wherein the stand-by detection circuit comprises an electronic switch configured to connect and disconnect the supply line of the control circuit from the cathode terminal.

Example 4: The rectifier device according to example 3, wherein the timer is configured to open the electronic switch when the cycle detection circuit has not reset the timer for the maximum time span.

Example 5: The rectifier device according to any of examples 1 to 4, wherein the timer includes a capacitor and a discharging circuit, and wherein the cycle detection circuit includes, to reset the timer, circuitry for charging the capacitor in each detected cycle.

Example 6: The rectifier device according to example 5, wherein the timer further includes a transistor which is activated when a capacitor voltage falls below a defined threshold voltage.

Example 7: The rectifier device according to any of examples 1 to 6, wherein the timer includes an oscillator and a counter configured to count consecutive pulses generated by the oscillator; and wherein the cycle detection circuit is configured to reset the counter value in each detected cycle.

Example 8: The rectifier device according to example 7, wherein the counter generates a stand-by signal when it reaches a predefined counter value.

Example 9. The rectifier device according to example 7 or 8, wherein the cycle detection circuit comprises a comparator configured to detect the alternating input voltage rising above a defined value.

Example 10: The rectifier device according to any of examples 1 to 9, wherein the control circuit comprises a supply circuit configured to generate an internal supply voltage.

In accordance with another example (Example 11), the rectifier device includes a plurality of transistor cells, which arc integrated in a semiconductor substrate, wherein the transistor cells connect a reference terminal and a substrate terminal of the rectifier device. A first transistor is composed of transistor cells included in the plurality of transistor cells, and a diode connects the reference terminal and the substrate terminal of the rectifier device. A control circuit is configured to switch on the first transistor for an on-time period, during which the diode is forward biased. Moreover, a stand-by detection circuit includes a cycle detection circuit, which is configured to detect cycles of a substrate voltage applied to the substrate terminal, and a timer, which is coupled to the cycle detection circuit. The timer is configured to be reset by the cycle detection circuit upon detection of a cycle of the substrate voltage, and to disconnect a supply line from the substrate terminal to the control circuit unless reset before a maximum time span has elapsed.

Example 12: The rectifier device of example 11, wherein the plurality of transistor cells are arranged in a well region formed in the semiconductor substrate, the well region and the adjoining semiconductor substrate thrilling a pn-junction of the diode.

Example 13: The rectifier device of example 11 or 12, wherein the electric potential at the reference terminal serves as ground potential for the rectifier device so that an alternating input voltage operably applied between the substrate terminal and the reference terminal determines the substrate voltage in the semiconductor substrate.

Example 14: The rectifier according to any of examples 11 to 13, wherein the stand-by detection circuit comprises an electronic switch configured to connect and disconnect the supply line of the control circuit from the substrate terminal.

Example 15: The rectifier according to example 14, wherein the timer is configured to open the electronic switch when the cycle detection circuit has not reset the timer for the maximum time span.

Moreover, a method for operating a rectifier device is described herein, wherein, in accordance with one example (Example 16), the rectifier device includes a semiconductor switch and a diode coupled in parallel between a first and a second terminal, and the method includes using a control circuit to detect that the diode is forward biased and to activate the semiconductor switch to bypass the diode upon detection that the diode is forward biased. The method further includes continuously detecting new cycles of an alternating input voltage applied across the diode and the semiconductor switch, and disconnecting a supply line of the control circuit unless a new cycle of the alternating input voltage is detected before a maximum time span has elapsed.

Example 17: The method of example 16, wherein disconnecting the supply line of the control circuit includes: resetting a timer upon detection of a new cycle of the alternating input voltage; and triggering disconnection of the supply line when the timer has not been reset for the maximum time span.

Example 18: The method of example 17, wherein resetting a timer includes: generating consecutive pulses by an oscillator; counting the consecutive pulses by increasing a counter value; and resetting the counter value upon detection of a new cycle of the alternating input voltage.

Example 19: The method of example 18, wherein disconnection of the supply line is triggered when the counter value reaches a preset maximum value.

Example 20: The method of example 18 or 19, further including the generation of an internal supply voltage for the control circuit, based on the alternating input voltage, wherein the electric potential at an anode of the diode serves as ground potential.

Although the invention has been illustrated and described with respect to one or more implementations, alterations and/or modifications may be made to the illustrated examples without departing from the spirit and scope of the appended claims. As mentioned above, the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

We claim:

1. A rectifier device comprising
a first MOS transistor having a load current path and a diode connected parallel to the load current path; an alternating input voltage is operably applied across the load current path and the diode;
a control circuit that is configured to switch on the first MOS transistor for an on tune period, during which the diode is forward biased; and
a stand-by detection circuit comprising:
    cycle detection circuit configured to detect cycles of the alternating input voltage; and
    timer coupled to the cycle detection circuit; the timer being configured to be reset by the cycle detection circuit upon detection of a cycle of the alternating input voltage, and to disconnect a supply line of the control circuit unless reset before a maximum time span has elapsed.

2. The rectifier device according to claim 1, further comprising a cathode terminal and an anode terminal, between which the alternating input voltage is applied;

wherein a potential of the anode terminal serves as ground potential for the control circuit.

3. The rectifier device according to claim 2, wherein the supply line of the control circuit couples the cathode terminal with the control circuit, and wherein the stand-by detection circuit comprises an electronic switch configured to connect and disconnect the supple line of the control circuit from the cathode terminal.

4. The rectifier device according to claim 3, wherein the timer is configured to open the electronic switch when the cycle detection circuit has not reset the time for the maximum time span.

5. The rectifier device according to claim 1, wherein the timer include a capacitor and a discharging circuit, and wherein the cycle detection circuit includes, to reset the timer, circuitry for charging the capacitor in each detected cycle.

6. The rectifier device according to claim 5, wherein the timer further includes a transistor which is activated when a capacitor voltage falls below a defined threshold voltage.

7. The rectifier device according to claim 1, wherein the timer includes an oscillator and a counter configured to count consecutive pulses generated by the oscillator; and wherein the cycle detection circuit is configured to reset the counter value in each detected cycle.

8. The rectifier device according to claim 7, wherein the counter generates a stand-by signal it reaches a predefined counter value.

9. The rectifier device according to claim 7, wherein the cycle detection circuit comprises a comparator configured to detect the alternating input voltage rising above a defined value.

10. The rectifier device according to claim 1, wherein the control circuit comprises a supply circuit configured to generate an internal supply voltage.

11. A rectifier device comprising:

a plurality of transistor cells integrated in a semiconductor substrate;

a first transistor being composed of transistor cells included in the plurality of transistor cells, the first transistor connecting a reference terminal and a substrate terminal of the rectifier device;

a diode connecting the reference term Ma and the substrate terminal of the rectifier device;

a control circuit that is integrated in the semiconductor substrate and configured to switch on the first transistor for an on-time period, during which the diode is forward biased; and a stand-by detection circuit comprising:
 a cycle detection circuit configured to detect cycles of a substrate voltage applied to the substrate terminal; and
 a timer coupled to the cycle detection circuit; the timer being configured to be reset by the cycle detection circuit upon detection of a cycle of the substrate voltage, and to disconnect a supply line from the substrate terminal to the control circuit unless reset before a maximum time span has elapsed.

12. The rectifier device of claim 11, wherein the plurality of transistor cells are arranged in a well region formed in the semiconductor substrate, the well region and the adjoining semiconductor substrate thrilling a pn-junction of the diode.

13. The rectifier device of claim 11, wherein the electric potential at the reference terminal serves as ground potential for the rectifier device so that an alternating input voltage operably applied between the substrate terminal and the reference terminal determines the substrate voltage in the semiconductor substrate.

14. The rectifier according to claim 11, wherein the stand-by detection circuit comprises an electronic switch configured to connect and disconnect the supply line of the control circuit from the substrate terminal.

15. The rectifier according to claim 14, wherein the timer is configured to open the electronic switch when the cycle detection circuit has not reset the timer for the maximum time span.

16. A method for operating a rectifier device that comprises a semiconductor switch and a diode coupled in parallel between a first and a second terminal; the method comprising:

using a control circuit to detect that the diode is forward biased and to activate the semiconductor switch to bypass the diode upon detection that the diode is forward biased;

continuously detecting new cycles of an alternating input voltage applied across the diode and the semiconductor switch;

disconnecting a supply line of the control circuit unless a new cycle of the alternating input voltage is detected before a maximum time span has elapsed.

17. The method of claim 16, wherein disconnecting the supply line of the control circuit comprises:

resetting a timer upon detection of a new cycle of the alternating input voltage; and trigger disconnection of the supply line when the timer has not been reset for the maximum time span.

18. The method of claim 17, wherein resetting a timer comprises:

generating consecutive pulses by an oscillator;

counting the consecutive pulses by increasing a counter value;

resetting the counter value upon detection of a new cycle of the alternating input voltage.

19. The method of claim 18, wherein disconnection of the supply line is triggered when the counter value reaches a preset maximum value.

20. The method of claim 18, further comprising:

generating an internal supply voltage for the control circuit, based on the alternating input voltage, wherein the electric potential at an anode of the diode serves as ground potential.

* * * * *

UNITED STATES PATENT AND TRADEMARK OFFICE
CERTIFICATE OF CORRECTION

PATENT NO. : 9,960,705 B1
APPLICATION NO. : 15/378867
DATED : May 1, 2018
INVENTOR(S) : Albino Pidutti and Damiano Gadler It is certified that error appears in the above-identified patent and that said Letters Patent is hereby corrected as shown below:

In the Claims

Column 25, Claim 11, Line 49: Replace "term MA and" with --terminal and--

Signed and Sealed this
Twenty-first Day of August, 2018

Andrei Iancu
*Director of the United States Patent and Trademark Office*